(12) United States Patent
Edman et al.

(10) Patent No.: US 9,123,908 B2
(45) Date of Patent: Sep. 1, 2015

(54) LIGHT-EMITTING ELECTROCHEMICAL CELL AND SYSTEM, USE THEREOF AND METHOD FOR THEIR OPERATION

(75) Inventors: Ludvig Edman, Umea (SE); Junfeng Fang, Hubei (CN); Piotr Matyba, Umea (SE)

(73) Assignee: Lunalec AB, Umea (SE)

( * ) Notice: Subject to any disclaimer, the term of this patent is extended or adjusted under 35 U.S.C. 154(b) by 1038 days.

(21) Appl. No.: 13/138,141

(22) PCT Filed: Jan. 21, 2009

(86) PCT No.: PCT/SE2009/000021
§ 371 (c)(1),
(2), (4) Date: Sep. 30, 2011

(87) PCT Pub. No.: WO2010/085180
PCT Pub. Date: Jul. 29, 2010

(65) Prior Publication Data
US 2012/0019161 A1    Jan. 26, 2012

(51) Int. Cl.
*H01L 51/50*    (2006.01)
(52) U.S. Cl.
CPC .................................. *H01L 51/5032* (2013.01)
(58) Field of Classification Search
None
See application file for complete search history.

(56) References Cited

U.S. PATENT DOCUMENTS

| 5,444,330 | A | * | 8/1995 | Leventis et al. ............... 313/506 |
| 5,895,717 | A | | 4/1999 | Cao et al. | |
| 6,326,091 | B1 | | 12/2001 | Schoo et al. | |
| 2007/0018153 | A1 | | 1/2007 | Cumpston et al. | |
| 2008/0084158 | A1 | | 4/2008 | Shao et al. | |

FOREIGN PATENT DOCUMENTS

| EP | 1746669 A2 | 1/2007 |
| JP | 11-508731 | 7/1999 |

(Continued)

OTHER PUBLICATIONS

Shao et al., "Long-lifetime polymer light-emitting electrochemical cells". Advanced Materials, 2007. 19(3): p. 365-+.

(Continued)

*Primary Examiner* — Gregory Clark
(74) *Attorney, Agent, or Firm* — Harness, Dickey & Pierce

(57) ABSTRACT

A light-emitting device comprises a first electrode, a second electrode, and a light-emitting active material contacting and separating the first and second electrodes. The device comprises a combination of a conjugated polymer and an electrolyte, said electrolyte comprising ions, allowing for electrochemical doping of the conjugated polymer. In the device, a ratio between the ions and the conjugated polymer is selected to allow for the formation of:
(i) a doped region at the respective electrode interface, which allows for injection and transport of electronic charge carriers into and through the doped regions, respectively, at zero or low overpotential, and
(ii) an effectively undoped region, separating the doped regions, wherein injected electronic charge carriers are recombineable under excitation of the conjugated polymer and the polymer is de-excitable under the emission of light. The ratio between the ions and the conjugated polymer is low enough for the undoped region to remain effectively undoped and free from said ions, as substantially all ions in the active material are locked up in the doped regions.

16 Claims, 18 Drawing Sheets

(56) References Cited

FOREIGN PATENT DOCUMENTS

JP 2007-27763 2/2007
WO WO-9740648 A1 10/1997

OTHER PUBLICATIONS

Lee et al., "Photophysical properties of tris(bipyridyl)ruthenium(II) thin films and devices". Physical Chemistry Chemical Physics, 2003. 5(12): p. 2706-2709.

Zhang et al. "Lifetime study of polymer light-emitting electrochemical cells". Journal of Applied Physics, 2006. 100(8).

Japanese Office Action dated Dec. 11, 2012 issued in corresponding Japanese Application No. 2011-546224.

Shin, Joon-Ho, et al. "Polymer Light-Emitting Electrochemical Cells: The Formation and Effects of Doping-Induced Micro Shorts". Advanced Functional Materials, 2006, 16, 949-956.

Spreitzer, Hubert, et al. "Soluble henyl-Substituted PPVs—New Materials for Highly Efficient Polymer LEDs". Advanced Materials, 1998, 10, No. 16, 1340-1343.

Shao, Yan, et al. "Long-Lifetime Polymer Light-Emitting Electrochemical Cells". Advanced Materials, 2007, 19, 365-370.

Wagberg, Thomas, et al. "On the Limited Operational Lifetime of Light-Emitting Electrochemical Cells". Advanced Materials, 2008, 20, 1744-1749.

Cao, Yong, et al. "Efficient, Fast Response Light-Emitting Electrochemical Cells: Electroluminescent and Solid Electrolyte Polymers with Interpenetrating Network Morphology". Appl. Phys. Lett. 68 (23), Jun. 1996, 3218-3220.

Hsiao, Chung-Chin, et al. "High-efficiency Polymer Light-Emitting Diodes Based on Poly[2-methoxy-5-(2-ethylhexyloxy)-1, 4-phenylene Vinylene] With Plasma-Polymerized CHF 3-modified Indium Tin Oxide as an Anode". Applied Physics Letters 88, 2006, 03512-1-033512-3.

Johansson, T., et al. "Light-Emitting Electrochemical Cells from Oligo (ethylene oxide)-Substituted Polythiophenes: Evidence for in Situ Doping". Chem. Mater 1999, 11, 3133-3139.

Malliaras, G.G., et al. "Electrical Characteristics and Efficiency of Single-Layer Organic Light-Emitting Diodes". Rapid Communications, vol. 58, No. 20, Nov. 15, 1998, 4 pages.

Wu, Xufeng, et al. "High-Quality Poly [2-methoxy-5-(2'=ethylhexyloxy)-p-phenylenevinylene] Synthesized by a Solid-Liquid Two-Phase Reaction: Characterizations and Electroluminescence Properties". Journal of Polymer Science:Part A: Polymer Chemistry, vol. 42, 2004, 3049-3054.

G. Santos, et al. "Opto-Electrical Properties of Single Layer Flexible Electroluminescence Device with Ruthenium Complex". Journal of Non-Crystalline Solids, 2008, 2571-2574.

Zhang. Yanguang, et al., "Lifetime Study of Polymer Light-Emitting Electrochemical Cells". Journal of Applied Physics 100, 2006, 084501-1 to 084501-8.

Lee, et al. "Photophysical Properties of Tris(Bipyridyl)Ruthenium(II) Thin Films and Devices". Phys. Chem. Chem. Phys., 2003, 5, 2706-2709.

J.C. de Mello, et al. "Ionic Space-Charge Effectsinpolymerlight-Emitting Diodes". The American Physical Society, May 1998, vol. 57, No. 20, 12951-12963.

PCT/IB/326 Notification Concerning Transmittal of Copy of IPRP.
PCT/IB/373 International Preliminary Report on Patentability.
PCT/ISA/237 Written Opinion of the International Searching Authority.

European Patent Office Action dated Feb. 5, 2015 for EP Application No. 09 788 456.3-1552.

* cited by examiner x = 0.04, y = 0.48, z = 0.48

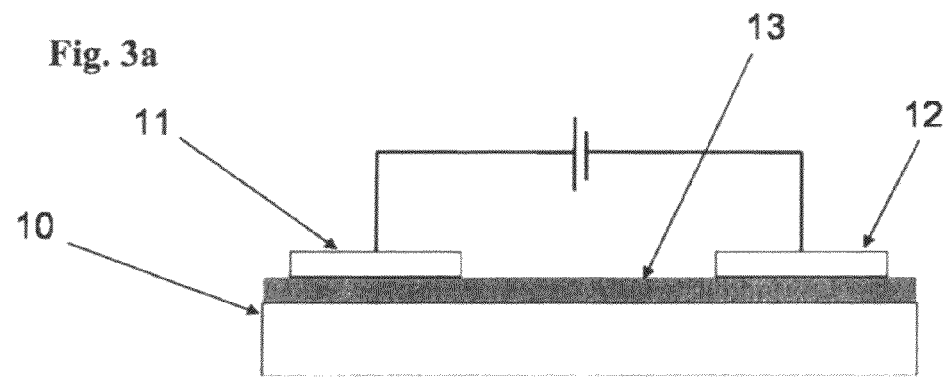
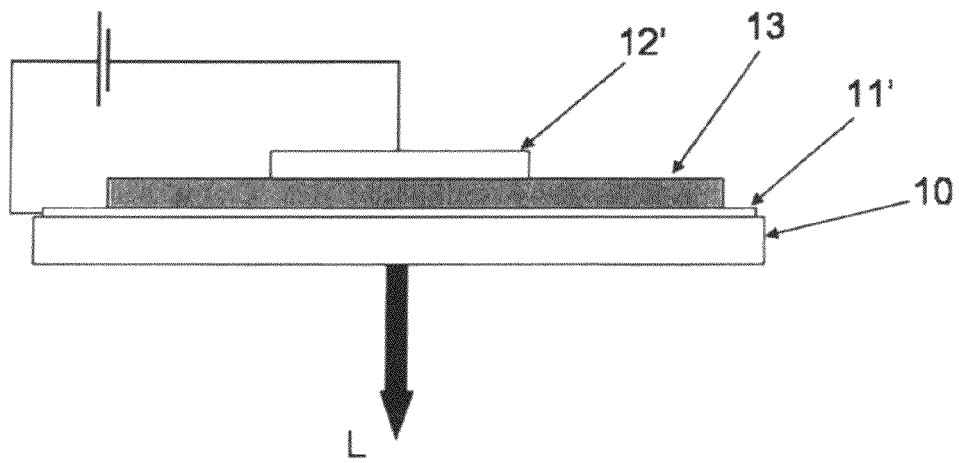

LIGHT-EMITTING ELECTROCHEMICAL CELL AND SYSTEM, USE THEREOF AND METHOD FOR THEIR OPERATION

TECHNICAL FIELD

The present disclosure relates to light-emitting devices based on a conjugated polymer with intermixed mobile ions as the active material positioned between two electrodes, which can allow for long operational lifetimes and efficient light emission. The light-emitting devices can be fabricated on flexible substrates and in flexible configurations.

BACKGROUND

The vision of a simultaneous efficient, durable, flexible, and low-cost light-emitting device is highly attractive from both an end-user and a producer perspective, but at the same time poses a significant scientific and technological challenge that remains effectively non-resolved as of now. Emerging fluorescent organic semiconductors can, in contrast to their more conventional inorganic counterparts, be processed by relatively simple methods at low temperatures, and are as such compatible with the employment of flexible substrates and low-cost roll-to-roll production. Accordingly, light-emitting devices based on organic semiconductors in the form of small molecules (SMs) or conjugated polymers (CPs) are attracting enormous scientific and commercial interest, with the current prime focus being aimed at the development of organic light-emitting diodes (OLEDs).

SM-based OLEDs exhibit an interesting attribute in that the properties of the active material can be tuned by controllable chemical doping of different layers within a multi-layer stack, and the performance of such appropriately designed devices have recently reached rather impressive levels. However, a notable drawback with SM-based OLEDs is that they are not typically amenable to solution processing and roll-to-roll fabrication, with a concomitant penalty in the simplicity and cost of fabrication. CP-based OLEDs, on the other hand, are compatible with a straightforward and low-cost solution processing of the polymeric active material, but suffer from the fact that doping is not realizable in practice. As a consequence, it is necessary to employ a low-work function and highly reactive cathode material in CP-OLEDs in order to attain good device performance, which has a negative impact on the device functionality from a fabrication and stability perspective.

An alternative, and frequently overlooked, organic light-emitting device is the light-emitting electrochemical cell (LEC). Its unique operation is based on that mobile ions are intimately intermixed with the organic semiconductor, and that these ions redistribute during device operation in order to allow for efficient electronic charge injection, transport and recombination. Moreover, CP-based LECs can be processed directly from solution using potentially cheap materials (based on common elements such as C, H, O, N, etc.), and accordingly offer most of the initially outlined requirements for the high-performance light-emitting device of the future. However, the significant drawback of the current generation of LECs, which rationalizes the as-of-yet limited interest from industry and academia, is related to a non-adequate operational lifetime.

There is prior art in the field of functional LECs with long lifetime, high power conversion efficiency, and/or flexible design.

US2008/0084158 and Shao, Y., G. C. Bazan, and A. J. Heeger, *Long-lifetime polymer light-emitting electrochemical cells*. Advanced Materials, 2007. 19(3): p. 365-+, discloses a significant operational lifetime for LEC devices of 100-1000 h. They disclose a dilute concentration of the electrolyte constituent (an ionic liquid) in the active material. These disclosures, however, are based on the theory that phase separation has a greatly limiting effect on the lifetime of the LEC. According to these disclosures, the improved lifetime is due to the fact that the two constituent materials in the active material (an ionic liquid and a conjugated polymer) form a single phase, since they are both hydrophobic.

Cao, Y., et al., *Efficient, fast response light-emitting electrochemical cells: Electroluminescent and solid electrolyte polymers with interpenetrating network morphology.* Applied Physics Letters, 1996. 68(23): p. 3218-3220, discloses a similar "single phase" approach when a surfactant is added to an active material mixture based on {MEH-PPV+ PEO+LiCF$_3$SO$_3$}. They attained LEC devices with operational lifetimes of approximately 100 h at significant brightness. Importantly, the authors employ conventional high concentrations of the LiCF$_3$SO$_3$ salt and the ion-dissolving and ion-transporting PEO polymer.

In the herein exploited field of LEC devices with an active material mixture comprising a hydrophobic conjugated polymer blended with a dilute concentration of a hydrophilic electrolyte (here the salt KCF$_3$SO$_3$ blended with the ion-dissolving and ion-transporting solid-state solvent PEO), which form a phase-separated active material, there appears to be very little prior art.

deMello, J. C., et al., *Ionic space-charge effects in polymer light-emitting diodes*. Physical Review B, 1998. 57(20): p. 12951-12963. discloses a low concentration of salt in some of their LEC devices, but the concentration of the ion-dissolving and ion-transporting solid-state solvent was kept high, and the total electrolyte content was therefore high. This disclosure further focuses on the operational mechanism of the devices and did, for instance, not report any data on the operational lifetime.

State-of-the-art OLEDs with solely MEH-PPV as the active material and with a power conversion efficiency of less than or approximately equal to 2 lm/W was demonstrated in Spreitzer, H., et al., *Soluble phenyl-substituted PPVs—New materials for highly efficient polymer LEDs*. Advanced Materials, 1998. 10(16): p. 1340-+, Hsiao, C. C., et al., *High-efficiency polymer light-emitting diodes based on poly 2-methoxy-5-(2-ethylhexyloxy)-1,4-phenylene vinylene with plasma-polymerized CHF3-modified indium tin oxide as an anode*. Applied Physics Letters, 2006. 88(3), Wu, X. F., et al., *High-quality poly 2-methoxy-5-(2'-ethylhexyloxy)-p-phenylenevinylene synthesized by a solid-liquid two-phase reaction: Characterizations and electroluminescence properties*. Journal of Polymer Science Part a-Polymer Chemistry, 2004. 42(12): p. 3049-3054, and Malliaras, G. G., et al., *Electrical characteristics and efficiency of single-layer organic light-emitting diodes*. Physical Review B, 1998. 58(20): p. 13411-13414, It is noteworthy that this high-performance OLEDs employ a low-work function and thus highly reactive metal for the cathode (typically Ca), while the herein disclosed LEC devices with MEH-PPV in the active material exhibit a similar or better power conversion efficiency while employing a stable Al cathode.

In Santos, G., et al., *Opto-electrical properties of single layer flexible electroluminescence device with ruthenium complex*. Journal of Non-Crystalline Solids, 2008. 354(19-25): p. 2571-2574, there is disclosed the first flexible SM-based LEC, but with a very modest brightness level of 1 cd/m$^2$ and a very low power efficiency of 0.003 lm/W.

Hence, there is a need for improved or alternative light-emitting devices, and in particular of such devices which have a longer operational life and/or which presents an increased versatility in terms of applications for use.

SUMMARY

It is a general object of the present disclosure, to provide a light-emitting device which alleviates or eliminates at least some of the disadvantages with prior art devices. Particular objects include providing light-emitting devices, systems, and/or operating schemes which enable longer operational life of the device.

The invention is defined by the appended independent claims, with embodiments being set forth in the appended dependent claims, in the following description and in the drawings.

According to a first aspect, there is provided a light-emitting device comprising a first electrode, a second electrode, and a light-emitting active material contacting and separating the first and second electrodes. The active material comprises a combination of a conjugated polymer and an electrolyte, said electrolyte comprising ions, allowing for electrochemical doping of the conjugated polymer. A ratio between the ions and the conjugated polymer is selected to allow for the formation of:

(i) a doped region at the respective electrode interface, which allows for injection and transport of electronic charge carriers into and through the doped regions, respectively, at zero or low overpotential, and (ii) an effectively undoped region, separating the doped regions, wherein injected electronic charge carriers are recombineable under excitation of the conjugated polymer and the polymer is de-excitable under the emission of light. The ratio between the ions and the conjugated polymer is low enough for the undoped region to remain effectively undoped and free from said ions, as substantially all ions in the active material are locked up in the doped regions.

For a specific particular combination of materials, geometry and temperature, the ratio (typically mass ratio) between the ions and the conjugated polymer can be determined by routine experiments, such as the ones described herein. The undoped region, will remain undoped, if the ion access is depleted before the doping fronts, which start growing from the respective electrode, meet.

The present disclosure is based on the understanding that a factor limiting the operational life of light-emitting devices are side reactions occurring in the active material. Hence, by limiting the amount of ions and other electrolyte constituents available in the active material, the occurrence and effect of such side reactions can be reduced, thereby increasing the operational life of the light-emitting device.

Compared with the prior art, a mixture of a hydrophobic conjugated polymer and a hydrophilic electrolyte is employed, thus forming an active material mixture that is prone to phase separation, and yet, similar or better operational lifetimes can be attained. Thus, a single phase active material is possible, but not a requirement, for long operational lifetimes in LEC, and commonplace hydrophilic electrolytes (essentially all electrolytes except ionic liquids) in general may be functional. This obviously expands the number of electrolytes that can be employed significantly.

Hence, the conjugated polymer may be hydrophobic and the electrolyte may be hydrophilic, or the conjugated polymer may be hydrophilic and the electrolyte may be hydrophobic. Thus, the two components may form a bi-phase or a multi-phase mixture.

The conjugated polymer and the electrolyte may form a phase separated mixture, components of which being separated on a scale ranging from 1 nm to 1 mm.

The components may be separated on a scale ranging from about 50 nm to about 100 µm, or about 400 nm to about 10 µm.

In the alternative, the combination may be a single phase combination.

The inventive concept described above may be combined also with a single phase device, i.e. a device comprising a hydrophilic conjugated polymer and a hydrophilic electrolyte, or a hydrophobic conjugated polymer and a hydrophobic electrolyte. In particular, the selections of materials for substrates, electrodes, conjugated polymer, and electrolyte may be the ones described herein. Also the concentrations of the constituent materials in the electrolyte may be as described herein as well as the drive scheme.

The ratio between the ions and the conjugated polymer may be selected to provide a width of the undoped region which effectively eliminates detrimental interactions between the excited conjugated polymer and the dopants in the doped regions and the ions.

In an embodiment where the electrodes at least partially overlap each other, the ratio between the ions and the conjugated polymer may be selected to result in said width of the effectively undoped region being about 10 nm to 200 nm, or about 10-100 nm or about 10-50 nm or about 20 nm.

In such an embodiment, the ratio between the mass of salt providing the ions and the mass of conjugated polymer may be selected as about 0.01-3 times, or about 0.1-3, or about 0.5-2 or about 0.5-1 times z, which may be calculated according to the formula:

$$z = \frac{x_{doping} \cdot (d_{tot} - d_{pn}) \cdot M_{salt}}{2 \cdot d_{tot} \cdot M_{CPru}},$$

wherein $x_{doping}$ is a doping concentration in the doped regions, $d_{tot}$ is an interelectrode distance, $d_{pn}$ is a width of the undoped region (in the interelectrode direction), $M_{salt}$ M is a molar mass of the salt, and $M_{CPru}$ is a molar mass of a repeat unit of the conjugated polymer. All of the parameters in the formula, with the exception of $d_{pn}$, can be determined or measured by routine experiments, such as the ones described herein. Thus, one specific z value correlates to one specific $d_{pn}$, which is selected, as given by the above formula.

The ratio between the mass of ions and mass of the conjugated polymer may be about 0.005-0.10, or about 0.01-0.06.

In another embodiment, the electrodes may be substantially co-planar, and the ratio between the ions and the conjugated polymer is selected to result in said width of the effectively undoped region being about 10 nm to 70 µm, or about 100 nm to 70 µm, or about 1 µm to 70 µm, or about 10 µm to 70 µm, or about 10 µm to 20 µm.

In either case, the ratio between the ions and the conjugated polymer may be selected to provide a brightness of more than 100 cd/m² for at least 20 hours of continuous operation, for at least 40 hours of continuous operation, for at least 60 hours of continuous operation, for at least 80 hours of continuous operation, for at least 100 hours of continuous operation, for at least 150 hours of continuous operation or for at least 200 hours of continuous operation, or for at least one month of continuous operation; or a brightness of more than 20 cd/m² is maintained for at least four months; a brightness of more than 400 cd/m² is maintained for at least four days; or a brightness of more than 1000 cd/m² is maintained for at least 24 hours.

The conjugated polymer may be selected from the group consisting of poly(para-phenylene vinylene) (PPV), polyfluorenylene (PF), poly(1,4-phenylene) (PP), polythiophene (PT), and neutral and ionic derivatives thereof.

Particularly, the conjugated polymer may be poly[2-methoxy-5-(2-ethyl-hexyloxy)-1,4-phenylenevinylene].

The conjugated polymer may comprise a phenyl-substituted PPV copolymer, such as superyellow.

The electrolyte may comprise a gel electrolyte.

In the alternative, or as a complement, the electrolyte may comprise a substantially solid electrolyte.

In the alternative, or as a complement, the electrolyte may comprise a substantially liquid electrolyte.

The device may further comprise a spacer, arranged to maintain a predetermined distance between the electrodes. When using a liquid or semisolid (gel) electrolyte, spacers may, depending on the design of the device, be used to keep the electrodes at a desired distance from each other, and to avoid short circuiting of the device.

The electrolyte may comprise a salt.

The salt may comprise at least one metal salt, comprising a cation, such as Li, Na, K, Rb, Mg, or Ag, and a molecular anion, such as $CF_3SO_3$, $ClO_4$, or $(CF_sSO_2)_2N$.

The electrolyte may comprise at least one ionic liquid.

The electrolyte in the active material may comprise an ion-dissolving material. A concentration of the ion-dissolving material may be large enough to allow for dissociation of the ions, and small enough to provide a brightness of more than 100 $cd/m^2$ for at least 20 hours of continuous operation, for at least 40 hours of continuous operation, for at least 60 hours of continuous operation, for at least 80 hours of continuous operation, for at least 100 hours of continuous operation, for at least 150 hours of continuous operation or for at least 200 hours of continuous operation, or for at least one month of continuous operation; or a brightness of more than 20 $cd/m^2$ is maintained for at least four months; a brightness of more than 400 $cd/m^2$ is maintained for at least four days; or a brightness of more than 1000 $cd/m^2$ is maintained for at least 24 hours.

For a particular combination of materials, geometry and temperature, the concentration of the salt and the ion-dissolving material can be determined by routine experiments, such as the ones described herein.

In particular embodiments, a mass ratio between the ion-dissolving material and the conjugated polymer may be about 0.01-0.25, about 0.01-0.20, about 0.01-0.17, about 0.05-0.25, about 0.05-0.20, about 0.05-0.17, about 0.08-0.25, about 0.08-0.20 or about 0.085-0.17.

The ion-dissolving material may comprise at least one polymer material.

The polymer material may be selected from a group consisting of poly(ethylene oxide), poly(propylene oxide), methoxyethoxy-ethoxy substituted polyphosphazane, and polyether based polyurethane, or combinations thereof.

The ion-dissolving material may comprise at least one non-polymer ion-dissolving material, such as a crown ether.

The active material may comprise a surfactant, or a polymeric non-ion-dissolving material, such as polystyrene.

In one particular embodiment, the electrolyte may comprise $KCF_3SO_3$ dissolved in poly(ethylene oxide).

The device may be formed on a substrate.

The substrate may be effectively non-flexible, e.g. a glass or a glass-like material.

The substrate may be effectively flexible. By "effectively flexible" is meant that the substrate is so flexible as to allow some visible bending without rupturing.

The substrate may comprise a polymeric material, such as poly(ethylene terephthalate), poly(ethylene naphthalate), poly(imide), poly(carbonate), or combinations or derivatives thereof.

The substrate may comprise a metal foil, such as steel, Ti, Al, Inconel alloy, or Kovar.

The substrate may comprise paper or paper-like material.

One or both electrodes may be directly or indirectly deposited on the substrate.

One or both of the first and second electrodes may be conducting and transparent or semi-transparent.

Specifically, the electrode may comprise a semi-transparent oxide, such as indium-tin oxide, or a thin film of a semi-transparent metal, such as Au, Ag, Pt, or Al.

In the alternative, or as a complement, one or both of the first and second electrodes is coated with a thin layer of a conducting polymer, such as poly(3,4-ethylenedioxythiophene)-poly(styrene sulfonate).

One or both of the first and second electrodes may comprise a metal. The metal may comprise a stable metal, such as Al, Ag or Au.

There is also disclosed a method for generating light, comprising a light-emitting device as described above, and a power source, connected to the first and second electrodes. A power source may be any means suitable for generating a power that can be used with the device, e.g. a battery or a converted mains voltage The power source may be arranged to provide a pre-biasing of the light-emitting device.

By such pre-biasing, it is possible to provide a more "clean" cathodic interface and a more centered p-n junction; the former is attractive since it may inhibit the formation of an overpotential at the cathodic interface. The consequences may be a longer operational life of the device and a higher power conversion efficiency. The latter may be attractive since it inhibits the quenching of the light emission by the metallic electrodes. The consequence may thus be a higher power conversion efficiency.

The power source is arranged to provide the pre-bias at a voltage and/or current and time period sufficient to form an effective p-n junction.

As a non-limiting example, the p-n junction may be effective where the light emission zone is at least 10 nm away from the electrode interface and where a major portion of the applied overpotential drops over the light-emission zone.

For example, the pre-biasing may be provided during a time period of less than 1 hour, less than 30 minutes, less than 20 minutes, less than 15 minutes, less than 10 minutes, less than 5 minutes, less than 1 minute, less than 30 seconds, less than 15 seconds, less than 5 seconds or less than 1 second.

The pre-biasing may be provided only when the light-emitting device is in a substantially pristine or relaxed state.

The power source may be arranged to provide a nominal drive voltage and a pre-biasing voltage, which is higher than the nominal drive voltage. A typical nominal drive voltage may be about 2-4 V, e.g. 2 V, 3 V or 4 V.

For example, the pre-bias voltage may be about 10%-1000% higher than the nominal drive voltage, about 10%-500% higher than the nominal drive voltage, about 10%-100% higher than the nominal drive voltage, about 30%-100% higher than the nominal drive voltage, or about 30%-50% higher than the nominal drive voltage.

The power source may be arranged to provide a nominal drive current and a pre-biasing drive current, which is higher than the nominal drive current.

A typical nominal drive current density may be about 100 A/m$^2$.

For example, the pre-biasing current may about 2-100 times that of the nominal drive current, about 2-50 times that of the nominal drive current, about 2-20 times that of the nominal drive current, or about 5-20 times that of the nominal drive current.

The power source may be arranged for driving the light-emitting device substantially galvanostatically. As galvanostatic drive circuits are well known, this would constitute a suitable drive scheme.

The power source may be arranged to be permanently connected to the light-emitting device.

According to a second aspect, there is provided use of the above described device or system for generating light.

According to a third aspect, there is provided a method for operating the above described device, comprising pre-biasing the light-emitting device.

The pre-bias may be provided at a voltage and time period sufficient to form an effective p-n junction.

For example, the pre-biasing may be provided during a time period of less than 1 hour, less than 30 minutes, less than 20 minutes, less than 15 minutes, less than 10 minutes, less than 5 minutes less than 1 minute, less than 30 seconds, less than 15 seconds, less than 5 seconds or less than 1 second.

The pre-biasing may be provided when the light-emitting device is in a substantially pristine or relaxed state.

A pre-biasing voltage may be provided, which is higher than a nominal drive voltage of the light-emitting device.

In the alternative, or as a complement, a pre-biasing current may be provided, which is higher than a nominal drive current of the light-emitting device.

The light-emitting device may be driven substantially galvanostatically.

The pre-biasing may be provided in connection with a use or testing of the component, which it forms part of.

BRIEF DESCRIPTION OF THE DRAWINGS

For a more complete understanding, reference is now made to the following descriptions taken in conjunction with the accompanying drawing.

FIGS. 3a-3b. are a schematic depiction of the device architecture in: FIG. 2a: a planar surface cell configuration, FIG. 2b: a vertical sandwich cell configuration.

DESCRIPTION OF EMBODIMENTS

In the following disclosure, it will be shown that it is possible to design and fabricate CP-based LECs (from here on LECs) with a record-long operational lifetime exceeding one month of uninterrupted operation at significant and efficient light emission. The approach is based on a combination of a careful tuning of the composition of the active material and the employment of an appropriate operational protocol. It is shown that these two approaches allow for the design of a doping structure resembling that of a SM-OLED, while at the same time minimizing lifetime-limiting chemical and electrochemical side reactions. It is also demonstrated the first functional flexible LEC, with a similar impressive device performance.

Figure 1:
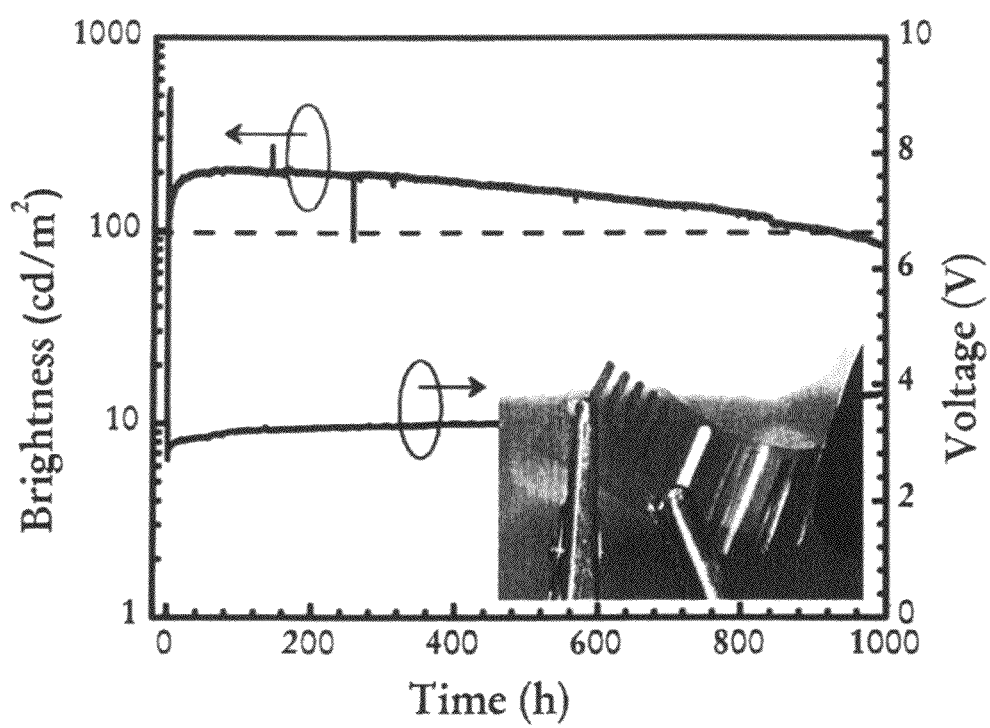
FIG. 1 illustrates the long-term operation of an ITO/PEDOT/{MEH-PPV:PEO:KCF$_3$SO$_3$}/Al sandwich cell with an active material mass ratio of 1:0.085:0.03. The device was operated at T=295 K and in galvanostatic mode. An initial "pre-bias" current, $I_{pre-bias}$=0.005 A, was applied for t=0.5 h, and it was followed by long-term uninterrupted operation at I=0.001 A. The inset illustrates the conformability of a similar device mounted on a flexible PET substrate during operation.

A generic device and method which result in a significant improvement of the operational lifetime and the power conversion efficiency of light-emitting electrochemical cells (LECs) will now be presented. Specifically, by employing a by design low concentration of a hydrophilic electrolyte (here {PEO+KCF$_3$SO$_3$}) blended with a hydrophobic conjugated polymer (here either MEH-PPV or superyellow), and by employing an appropriate operational protocol where the distinguishing feature is a high prebias during the initial operation, it is possible to demonstrate operational lifetimes of ~1000 h at a significant brightness of >100 cd/m$^2$ and relatively high power conversion efficiency (2 lm/W for MEH-PPV, 6 lm/W for superyellow). The temporal evolution of the brightness and the voltage for such a durable LEC with MEH-PPV as the conjugated polymer is presented in FIG. 1. Moreover, the first functional flexible LEC with a similar promising device performance is disclosed, and such a conformable device during operation is presented in the inset.

The origin to the improved device performance over previous LEC devices is an effective inhibition of undesired side reactions. Below it is rationalized i) why chemical side reactions in the light-emitting region of the device will be eliminated/minimized via the optimization of the electrolyte content in the active material, and ii) why electrochemical side reactions at the electrode interfaces will be eliminated/minimized via the employment of an appropriate operational protocol. First, the former achievement (i) will be described in detail.

Figure 2A:
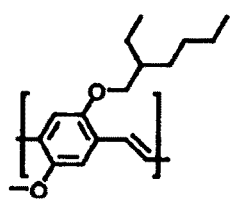
FIGS. 2a-2d. illustrates chemical structures of poly[2-methoxy-5-(2-ethylhexyloxy)-1,4-phenylenevinylene] (MEH-PPV), polyethylene oxide (PEO), KCF$_3$SO$_3$ and "superyellow".
Figure 2B:
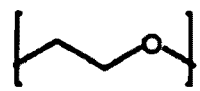
Figure 2C:
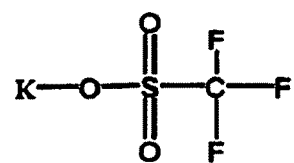

The influence of the ion concentration on the device performance of planar LECs in a "surface cell" configuration was investigated (see FIG. 3a for a schematic of the device configuration). The device structure consists of an active material mixture 13 of the conjugated polymer poly[2-methoxy-5-(2-ethylhexyloxy)-1,4-phenylenevinylene] (MEH-PPV, see FIG. 2a), the ion-solvating and ion-transporting polymer poly(ethylene oxide) (PEO, see FIG. 2b) and the salt KCF$_3$SO$_3$ (see FIG. 2c) positioned on top of, or below, two Au electrodes 11 and 12 with a 1 mm inter-electrode gap; the electrode/active material assembly is positioned on top of a substrate 10. For experimental details regarding the preparation and operation of surface cells, see appendix 1.

Figure 4:
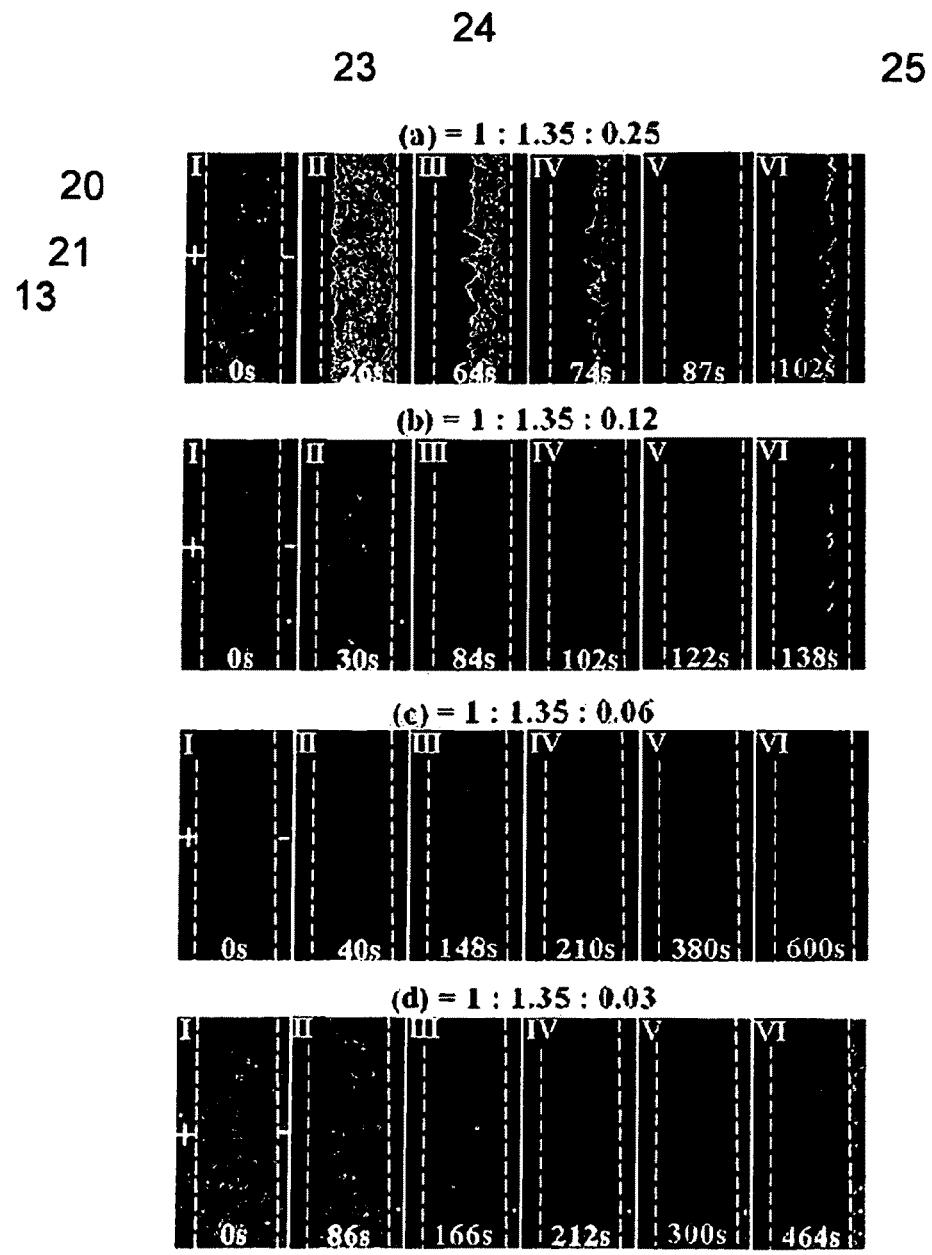
FIGS. 4a-4d. are photographs of planar Au/MEH-PPV+PEO+KCF$_3$SO$_3$/Au LECs with an interelectrode gap of 1 mm during operation at V =5 V and T =360 K. The MEH-PPV:PEO:KCF$_3$SO$_3$ mass ratios are included in the heading of each set of photographs. The positive and negative electrodes are identified in photograph I, and the doped MEH-PPV corresponds to the dark regions progressing from the electrode interfaces.

FIG. 4 presents photographs recorded during the operation of four representative planar surface cell devices with (from top to bottom) gradually decreasing salt concentration. The devices were operated under UV light (which excites the photoluminescence, PL, of MEH-PPV) in a dark room, so that the doped MEH-PPV in the gap can be distinguished as dark regions (with doping-quenched PL). The positive electrode 20 is marked with + and the negative electrode 21 with − in photograph I. All devices exhibit both p-type doping formation 23 at the positive electrode and n-type doping formation 24 at the negative electrode (see photographs III and IV). A continuous light-emitting p-n junction 25 is only formed in the topmost two "ion-rich" devices (photograph VI in FIGS. 4a and b), while the most "ion-poor" device do not exhibit any p-n junction formation as the two doping fronts come to a complete stop at a significant distance from each other (FIG. 4d). (Note that schematics illustrating the p-type and n-type doping processes in LECs are presented in FIG. 6.)

Figure 5:
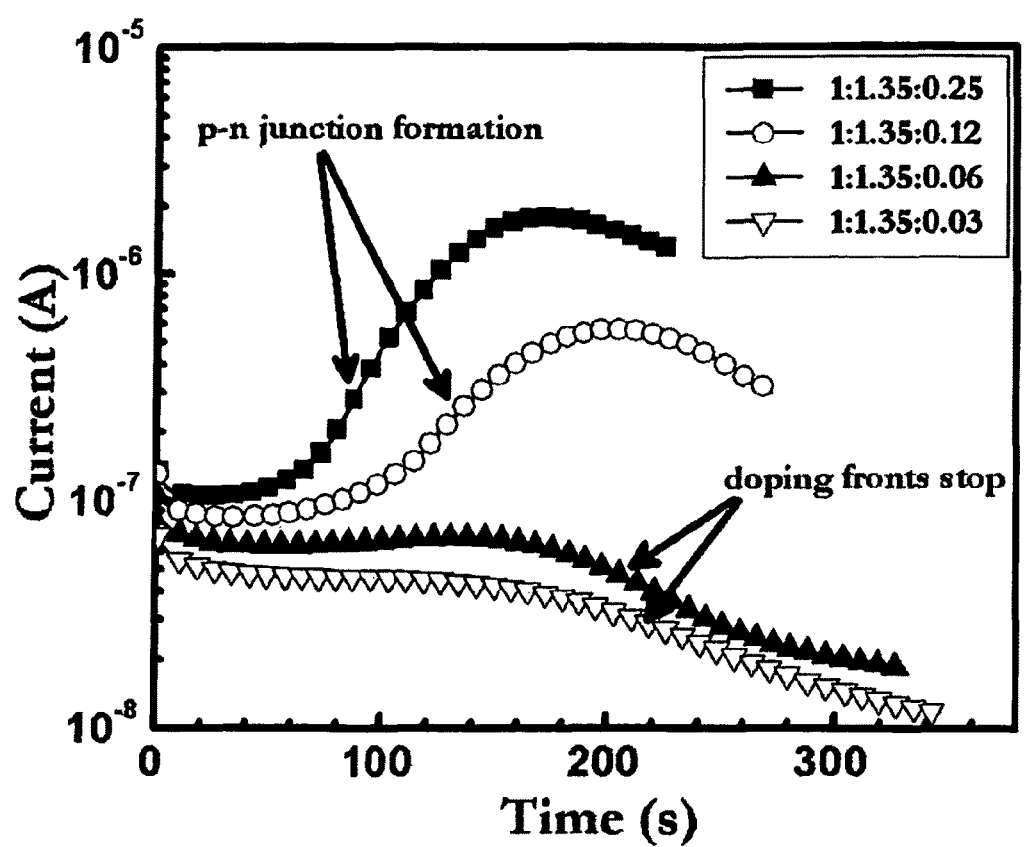
FIG. 5. illustrate current vs. time for planar Au/{lMEH-PPV+PEO+KCF$_3$SO$_3$}/Au LECs with an interelectrode gap of 1 mm during operation at V =5 V and T =360 K. The MEH-PPV:PEO:KCF$_3$SO$_3$ mass ratios are included in the inset.

FIG. 5 presents current vs. time graphs recorded in parallel with the photographs in FIG. 4. Each graph represents an average of data from 6-10 devices. A notable increase in current with time is only observed in the two ion-rich devices, which exhibit light-emitting p-n junction formation.

By integrating the current from the initial appearance of doping up to the time of the p-n junction formation in the two ion-rich devices and up to the time when the doping front motion stop in the ion-poor devices, and dividing this charge with the observed volume of the doped regions (as extracted from FIG. 4 and thickness measurements executed with atomic force microscopy), we find that the doping concentration in the p-type and n-type doped regions is essentially the same independent of ion concentration; $x_p \approx 0.09 \pm 0.02$ dopants/MEH-PPV repeat unit and $x_n \approx 0.13 \pm 0.03$ dopants/MEH-PPV repeat unit. This observation is consistent with that the current, and thus the effective device resistance, is the same for the two ion-rich devices at the time of p-n junction formation (see FIG. 5). The ion-poor devices contain a significant un-doped region with low conductivity, and the effective device resistance is accordingly invariably significantly higher.

The conclusions that follows from these observations are that the doping fronts propagate at essentially constant doping concentration until either (i) they meet and a light-emitting p-n junction forms (see FIGS. 4a and 4b), or (ii) all ions in the active material are consumed in electrochemical doping at which point the doping front progression will stop without junction formation (as observed in FIGS. 4c and 4d).

Figure 6:
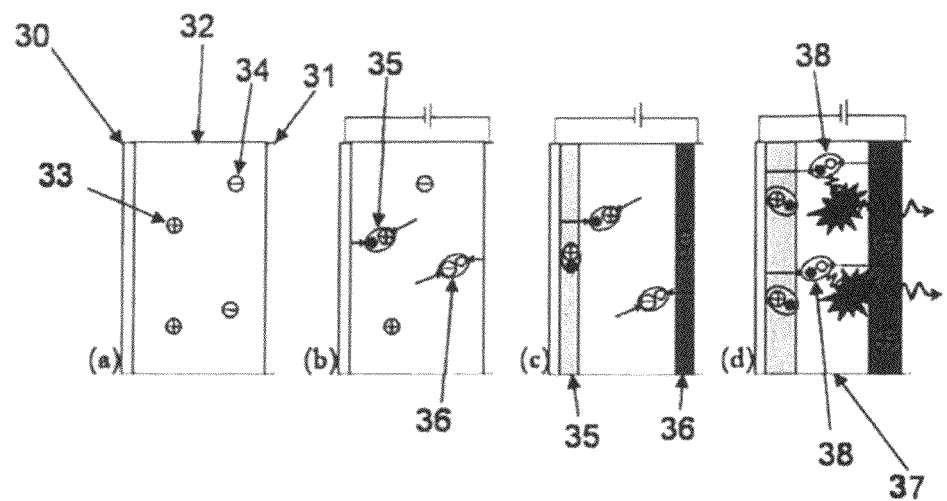
FIGS. 6a-6d. schematically illustrate a non-biased pristine LEC (FIG. 5a), and the doping (Figs b and c), and light-emission (FIG. 5d) processes in an LEC device. The initial doping formation and progression stops at ion depletion (FIG. 5d), so that an appropriately sized undoped p-n junction can be designed with a width corresponding to twice the exciton diffusion distance (FIG. 5d). The electric double layers at the charge-injecting interfaces are omitted for clarity.

This new knowledge provides a guideline for the appropriate design of the doping structure in more conventional and practical "sandwich cell" LECs (herein, as schematically presented in FIG. 3b, comprising a thin layer of active material 13' with a total thickness of $d_{tot}$~150 nm sandwiched between a transparent indium-tin oxide, ITO, anode 11' on a glass substrate 10 and an Al cathode 12'). The proposed doping design scenario is depicted in FIG. 6. The concept is that efficient electronic charge injection and transport are dependent on the existence of distinct doped regions next to the electrodes (cathode 30 and anode 31 in FIG. 6a), while the efficient radiative recombination of injected holes and electrons is benefiting from the existence of an undoped p-n junction region 37 with a width of $d_{pn}$ of the order of 20 nm. The size of the latter is motivated by that the recombination of holes and electrons will take place in the undoped p-n junction region, that the effective diffusion distance of an exciton (a bound electron-hole pair) is approximately 10 nm, and that doping effectively quenches the fluorescence of CPs. Moreover, by locking up all cations 33 and anions 34 in the active material 32 as counter-ion dopants in the distinct doped regions, the interaction between on the one hand the excitons formed in the p-n junction region and on the other hand the ions located in the doped regions and/or the dopants is minimized, which could be beneficial for the operational lifetime.

The proposed scenario during turn on of such an optimized LEC is depicted in FIG. 6. p-type and n-type doping formation and progression (36 and 35, respectively) take place at constant doping concentration (see FIGS. 6b and 6c) until ion depletion sets in and the designed p-n junction 37 is formed (see FIG. 6d). With such a doping structure in place, one can expect that the interactions between the excitons 38 formed in the p-n junction region on the one hand and non-existing uncompensated ions and/or far-away dopants in the doped regions will be minimized, as depicted in FIG. 6d. In other words, the width of the p-n junction is designed to minimize the leakage of diffusing excitons into the doped regions, without compromising the efficiency of electronic injection and transport. Moreover, such a minimization of the salt concentration will effectively decrease the interactions between excitons and ions/dopants, which could decrease undesired side reactions in the p-n junction region and concomitantly improve the operational lifetime.

The "ideal" ratio between the mass of salt and the mass of CP in the active material ($z_{ideal}$), which allows for this desired doping structure, can be calculated with the following general equation (for derivation, see appendix 2):

$$z = \frac{m_{salt}}{m_{CP}} = \frac{x_{doping} \cdot (d_{tot} - d_{pn}) \cdot M_{salt}}{2 \cdot d_{tot} \cdot M_{CPru}} \quad (1)$$

where $x_{doping}$ is the doping concentration in the doped regions, $d_{tot}$ is the total length of the active material (equal to the interelectrode distance), $d_{pn}$ is the length (in the interelectrode direction) of the undoped region, $M_{salt}$ is the molar mass of the salt, and $M_{CPru}$ is the molar mass of a repeat unit of the conjugated polymer.

By plugging in relevant values in Eq. (1), it is found that the ideal z value that allows for the formation of the desired doping structure with $d_{pn}$=20 nm is $z=z_{ideal}$=0.03 for sandwich cells with $d_{tot}$~150 nm and with an active material of {MEH-PPV+PEO+KCF$_3$SO$_3$}.

Figure 7:
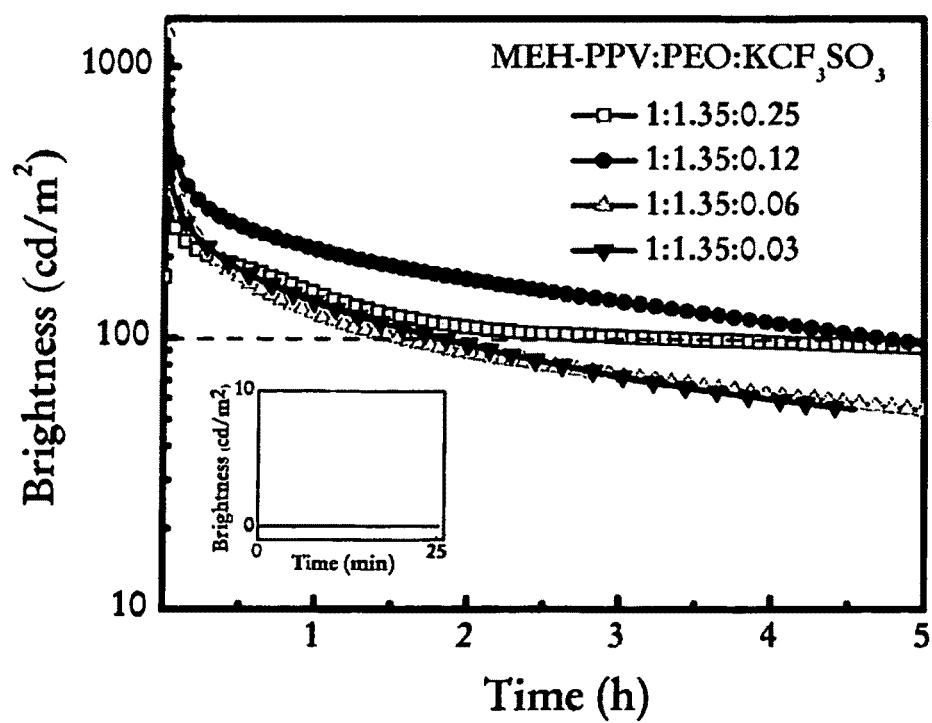
FIG. 7. illustrates the temporal evolution of the brightness of ITO/{MEH-PPV:PEO:KCF3SO3}/Al sandwich cells with different KCF3SO3 salt concentration in the active material, as specified in the upper inset. The lower inset presents data for a device with no salt in the active material. All devices were driven at V =3 V and T =360 K.

FIG. 7 presents the brightness as a function of time for sandwich-cell LECs with a mass ratio between the KCF$_3$SO$_3$ salt and the MEH-PPV in the active material ranging from z=0.25 to z=0.03, as specified in the upper inset. (Details on the preparation of sandwich cell devices are included in example 1.) A device with z=0 was also tested under the same conditions, but no light emission could be detected (see lower inset), which is as expected considering the significant barrier for electron injection from an Al cathode into the undoped MEH-PPV. The devices were operated at V=3 V and T=360 K; the employment of the elevated temperature, which is found to lower the operational lifetime by a factor of ~2, is motivated by that it allowed us to screen a significant number of devices within a reasonable time frame (all presented data are averages recorded on at least two pristine devices). Both the operational lifetime (defined as the time at which the brightness drops below 100 cd/m$^2$) and the power efficiency (~0.2 lm/W; data not shown) are relatively independent on the salt concentration, which demonstrate that an functional doping structure can be attained at a low z=0.03, but that the main culprit behind the limited operational lifetime of LECs is not originating in side reactions stemming solely from an excess of salt; more specifically the main lifetime-limiting reaction is not due directly to interactions between excitons and uncompensated ions and/or dopants.

However, the active material of LECs typically contains a third ion-solvating and ion-transporting component (here, PEO) in addition to the CP and the salt, and so attention is now shifted to the influence of the PEO concentration on LEC performance. It is chosen to keep the mass ratio between the KCF$_3$SO$_3$ salt and MEH-PPV constant at the low value of z=0.03 and to vary the mass ratio between PEO and MEH-PPV from y=1.35 (a typical value used in devices) to y=0.085.

Figure 8:
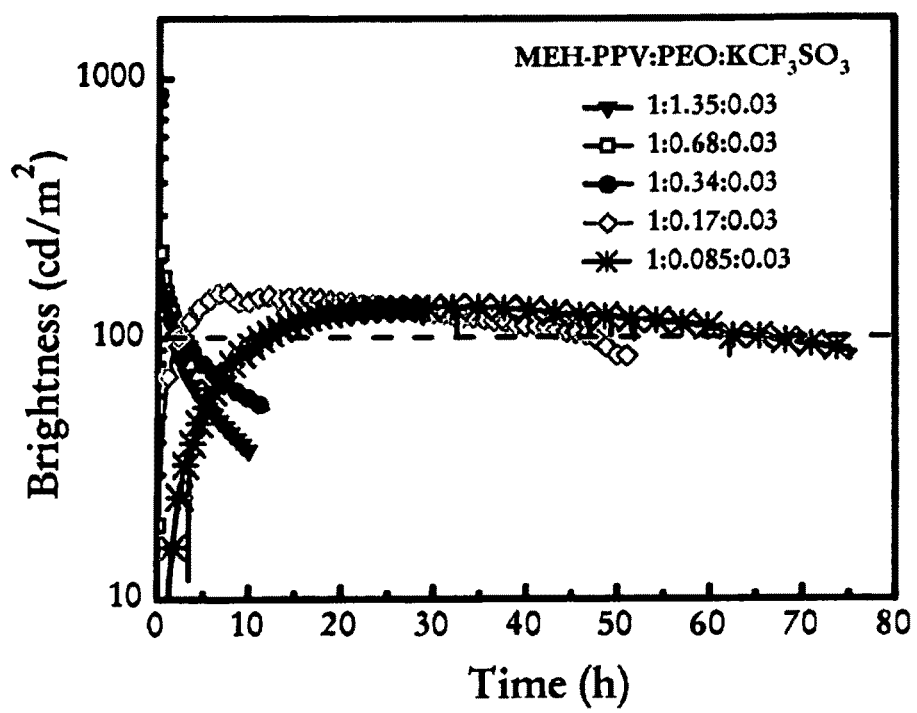
FIG. 8. illustrates the temporal evolution of the brightness of ITO/{MEH-PPV:PEO:KCF3SO3}/Al sandwich cells with different PEO concentration in the active material, as specified in the upper inset. The devices were driven at V =3 V and T =360 K.

FIG. 8 reveals that the concentration of PEO has a profound influence on the device performance. it is found that the operational lifetime increases in a monotonous and drastic fashion with decreasing amount of PEO from ~2 h at y=1.35 to ~65 h at y=0.085. The power efficiency is still rather modest, even though the low-PEO content devices (y≤0.34) exhibit a larger power efficiency at ~0.5-0.7 lm/W as compared to ~0.2 lm/W for the device with the high PEO content of y=1.35 (data not shown).

Furthermore, the open planar surface-cell structure with the same active material constituents was utilized in an attempt to identify the chemical signatures and the spatial position of life-time limiting side reactions in LECs, as described in Wågberg, T., et al., *On the limited operational lifetime of light-emitting electrochemical cells.* Advanced Materials, 2008. 20(9): p. 1744-1746. By optically probing post-mortem devices, it was found that the vinyl group and the fluorescence capacity of the MEH-PPV polymer are strongly and irreversibly damaged at the end of LEC operation, but only in a limited spatial region at, or in the close vicinity, of the p-n junction.

Thus, considering the results presented in FIGS. 7 and 8 it is highly plausible that the main lifetime-limiting reaction is related to the spatial co-existence and chemical interaction between an exciton on an MEH-PPV chain and the {PEO+KCF$_3$SO$_3$} electrolyte. It is further proposed that this irreversible chemical reaction is initiated by an electron transfer from the LUMO of the photo-excited MEH-PPV to an unoccupied energy level in the {PEO+KCF$_3$SO$_3$} electrolyte, and that the subsequent chemical reactions include a chemical attack of the exposed vinyl group of the MEH-PPV polymer. The effective decrease in the interaction between MEH-PPV excitons in the p-n junction region and the electrolyte, when the electrolyte content in the active material is decreased from a conventional high fraction (here, y=1.35, z=0.25) to a significantly lower fraction (y=0.085, z=0.03), rationalizes the dramatic 30-fold increase in device lifetime, as observed in FIG. 8.

Figure 9:
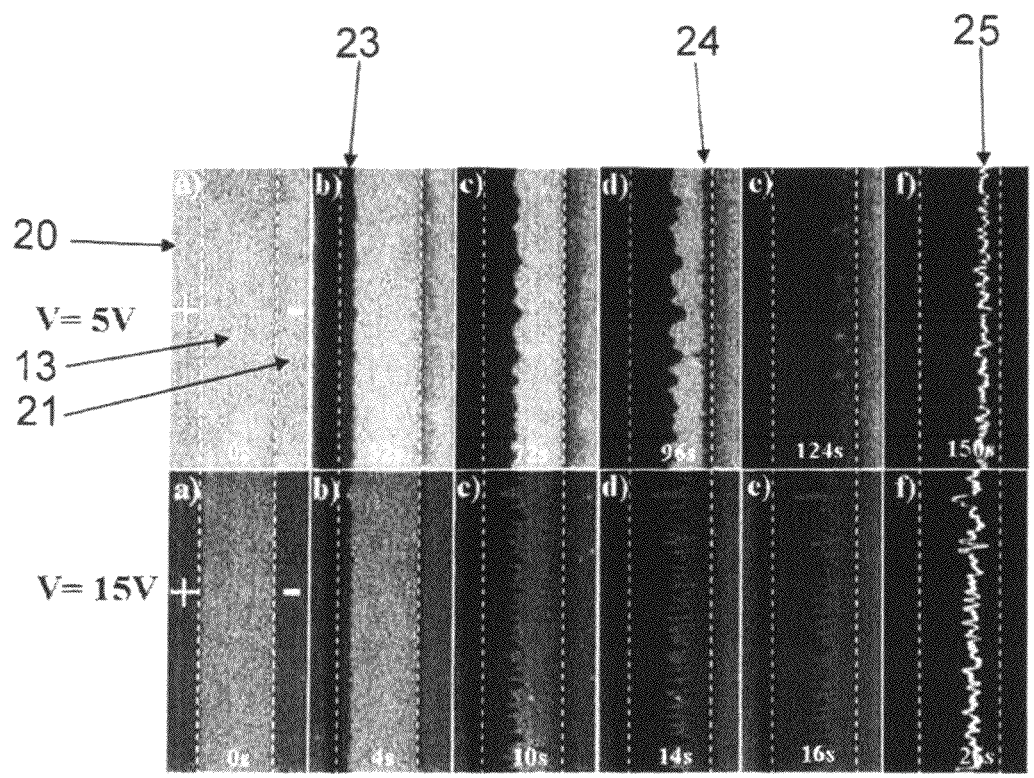
FIG. 9. illustrates doping front propagation and subsequent light emission in planar Au/{MEH-PPV +PEO +KCF3SO3}/Au surface cells with a 1 mm interelectrode gap during operation at T =360 K and V =5 V (top panel) and V =15 V (bottom panel), respectively. The time of applied voltage is indicated in the bottom part of each photograph.

Attention is now shifted to the second part (ii), namely the influence of the operational protocol on device performance. FIG. 9 presents sequences of photographs of the doping front progression and the subsequent light emission for two representative planar Au/{MEH-PPV+PEO+KCF$_3$SO$_3$}/Au surface cell devices with a 1 mm inter-electrode gap. The positive anode 20 is positioned to the left and the negative cathode 21 is positioned to the right in the photographs. The doped regions 23 and 24 appear as dark areas originating at the electrode interfaces (marked with dashed lines). The device presented in the upper panel of photographs was biased at V=5 V, and the device presented in the lower panel was biased at V=15 V. The presented photographs were selected such that the p-type doping front had progressed the same distance in the inter-electrode gap in the two photographs marked with the same letter.

It is clear that the n-type doping onset, compared to the p-type doping onset, is delayed in both devices (as observed also in the devices in FIG. 4); see the two photographs b) in FIG. 9, where p-type doping 23 but not n-type doping 24 is apparent. Moreover, this delay of the n-type doping onset is significantly more prominent in the device biased at V=5 V, as seen in the first signs of n-type doping 24 already in photograph c) in the device biased at V=15 V but only in photograph d) in the device biased at V=5 V. The delay of the n-type doping onset has the direct consequence that the light-emitting p-n junction 25 is formed closer to the negative cathode 21 in the device biased at V=5 V (see photographs e and f).

Two other interesting and consistent observations in all the devices investigated (>40 in total) concern the shape of the doping front. First, the shape of the p-type front becomes more jagged with time and with increasing voltage, which is a direct consequence of the ion-transport limited turn-on process. Second, and here more relevant, the initial n-type front exhibits a spike-like appearance that is absent in the initial p-type front. This issue will be returned to later.

Figure 10:
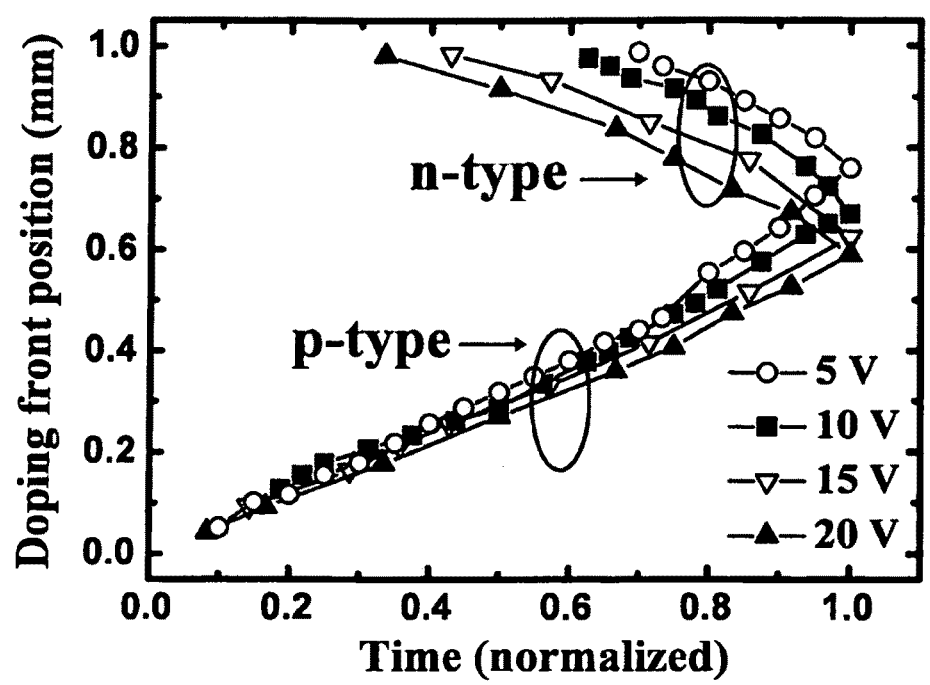
FIG. 10. illustrates average positions of the p-type and the n-type doping front, respectively, as a function of time (normalized to the time at which the p-n junction forms) for planar Au/{MEH-PPV +PEO +KCF3SO3}/Au surface cells with a 1-mm inter-electrode gap during operation at various applied voltages.

FIG. 10 presents the average positions of the p-type doping front and the n-type doping front as a function of time (normalized to the time at which the p-n junction forms) at various applied voltages. Three general trends are apparent: (i) the onset time for p-type doping is essentially independent of the applied voltage; (ii) the delay in the n-type doping onset is more significant at lower applied voltage; and (iii) the average position of the light-emitting p-n junction (as observed at time=1.0) is shifted towards the negative cathode with decreasing applied voltage, from 0.59 mm away from the positive anode in devices with a 1-mm inter-electrode gap at V=20 V to 0.76 mm at V=5 V.

A similar behavior with decreasing temperature is observed, as it is found that the delay in the n-type doping onset, as compared to the p-type doping onset, increases significantly and that the p-n junction shifts cathodically at lower temperatures (data not shown). Since it is well-established that these active materials exhibit a strongly temperature-dependent ionic conductivity, we attribute the increasing delay in the n-type doping onset, and the resulting cathodic shift of the p-n junction, to reduced ionic conductivity.

Balanced redox must be maintained at the two electrode interfaces in an LEC during the doping progression. (Although, it is in principle possible that limited Faradaic doping at one electrode can be compensated by non-Faradaic electric double-layer formation at the other electrode, it has been shown in J. H. Shin, S. Xiao, and L. Edman, *Polymer light-emitting electrochemical cells: The formation and effects of doping-induced micro shorts*. Advanced Functional Materials, 2006. 16(7): p. 949-956, that this effect is too minor to explain, e.g., the significant delay in n-type doping onset in the wide-gap devices studied in FIGS. 9 and 10.[10]) Thus, it must be that another electrochemical reaction than n-type doping of the CP can take place at the cathodic interface, and it is chosen to collectively term such reactions as "electrochemical side-reactions".

Figure 11:
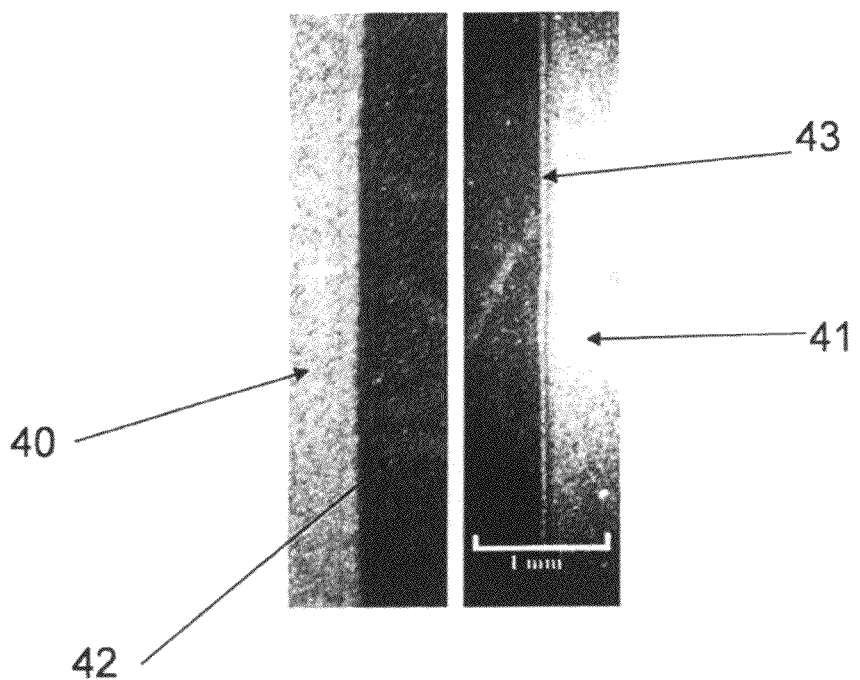
FIG. 11. are optical microscopy images of the anodic (left) and cathodic (right) interfaces after 12 h operation at V =30 V and T =360 K of a planar Au/{MEH-PPV +PEO +KCF3SO3}/Au surface cell with a 1-cm inter-electrode gap. The white line just to the left of the Au electrode on the right appears to be the product of a cathodic electrochemical side reaction.

Direct visual evidence for an electrochemical side-reaction at the cathodic interface in devices which exhibit significant time difference between the onset of p-type and n-type doping is provided by optical microscopy images. FIG. 11 shows the anodic interface 40 (left) and the cathodic interface 41 (right) of a planar Au/{MEH-PPV+PEO+KCF$_3$SO$_3$}/Au surface cell with an extremely large inter-electrode gap of 1 cm after long-term operation at V=30 V. While the anodic interface 40 retains a "clean" appearance after the long-term operation, a bright "degradation layer" 43 has emerged at the cathodic interface between the negative Au electrode and the {MEH-PPV+PEO+KCF$_3$SO$_3$} active material 42. It is interesting to find that the degradation layer is easiest to discern in devices that exhibit slow doping kinetics, i.e., devices operated at a low overpotential and/or low temperature (when the ionic conductivity of the active material is very low), and with large inter-electrode gaps.

Figure 12:
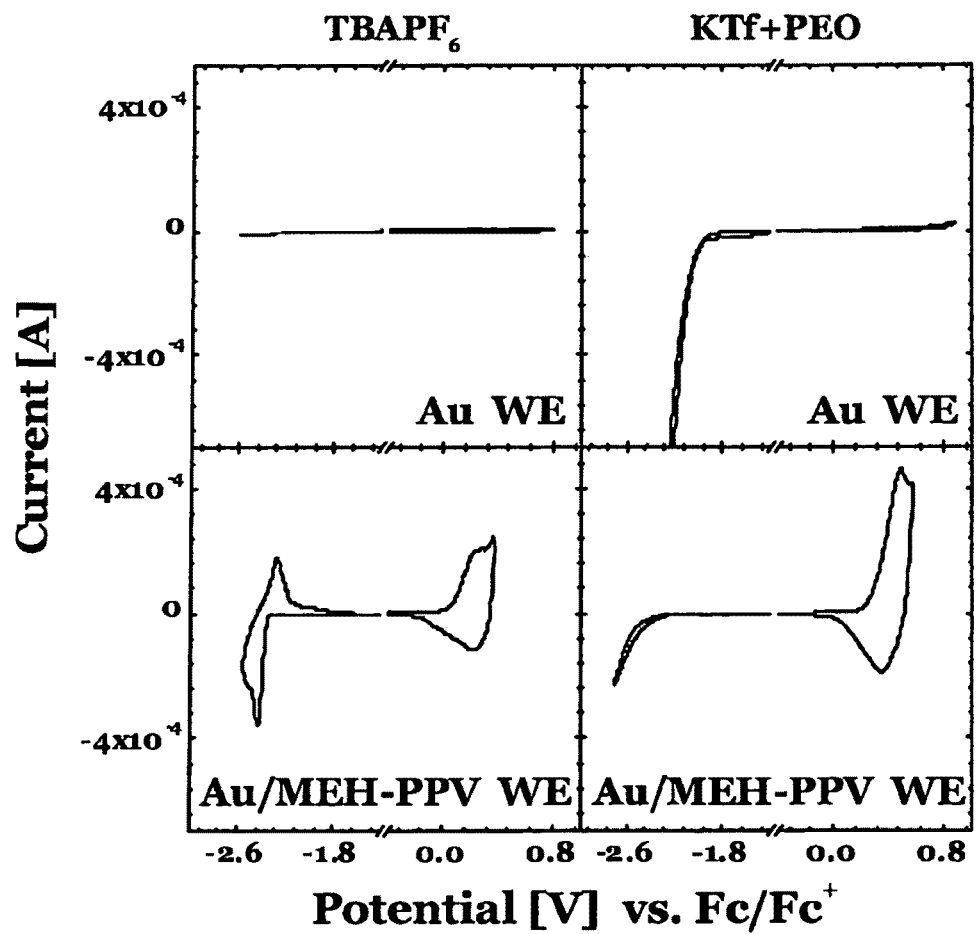
FIG. 12. illustrate cyclic voltammetry data recorded using a working electrode (WE) of Au (top graphs) and Au coated with a thin film of MEH-PPV (lower graphs). The electrolyte solution was 0.1 M TBAPF6 in CH3CN (left graphs) and 0.1 M KCF3SO3+2 M PEO in CH3CN (right graphs), respectively. A silver wire was used as the quasi-reference electrode, and it was calibrated vs. the Fc/Fc+reference redox couple at the end of each measurement. The counter electrode was Pt, and the scan rate was 25 mV/s.

Insight into the electronic structure of the various components in the LEC, i.e., the Au electrode, the MEH-PPV polymer, and the {KCF$_3$SO$_3$+PEO} electrolyte, is provided by cyclic voltammetry (CV). FIG. 12 shows CV data recorded employing either bare Au (top graphs) or Au coated with a thin film of MEH-PPV (lower graphs) as the working electrode, and using either TBAPF$_6$ in CH$_3$CN (left graphs) or {KCF$_3$SO$_3$+PEO} in CH$_3$CN (right graphs) as the electrolyte solution. The top left graph demonstrates that the bare Au electrode is electrochemically inert in the probed voltage range (spanning between -2.6 V and +0.8 V vs. the Fc/Fc$^+$ couple), while the lower left graph demonstrates that MEH-PPV can be reversibly n-type doped (reduced) at -2.3 V vs. Fc/Fc$^+$ and reversibly p-type doped (oxidized) at +0.1 V vs. Fc/Fc$^+$. When the electrolyte is changed from TBAPF$_6$ to {KCF$_3$SO$_3$+PEO} the situation changes in that an irreversible reduction reaction emerges in both the bare Au-electrode system (top right graph) and in the MEH-PPV-coated Au-electrode system (bottom right graph). Based on these data, the conclusion may be drawn that the {KCF$_3$SO$_3$+PEO} electrolyte is irreversibly reduced at a lower potential than MEH-PPV is reversibly n-type doped.

Figure 13:
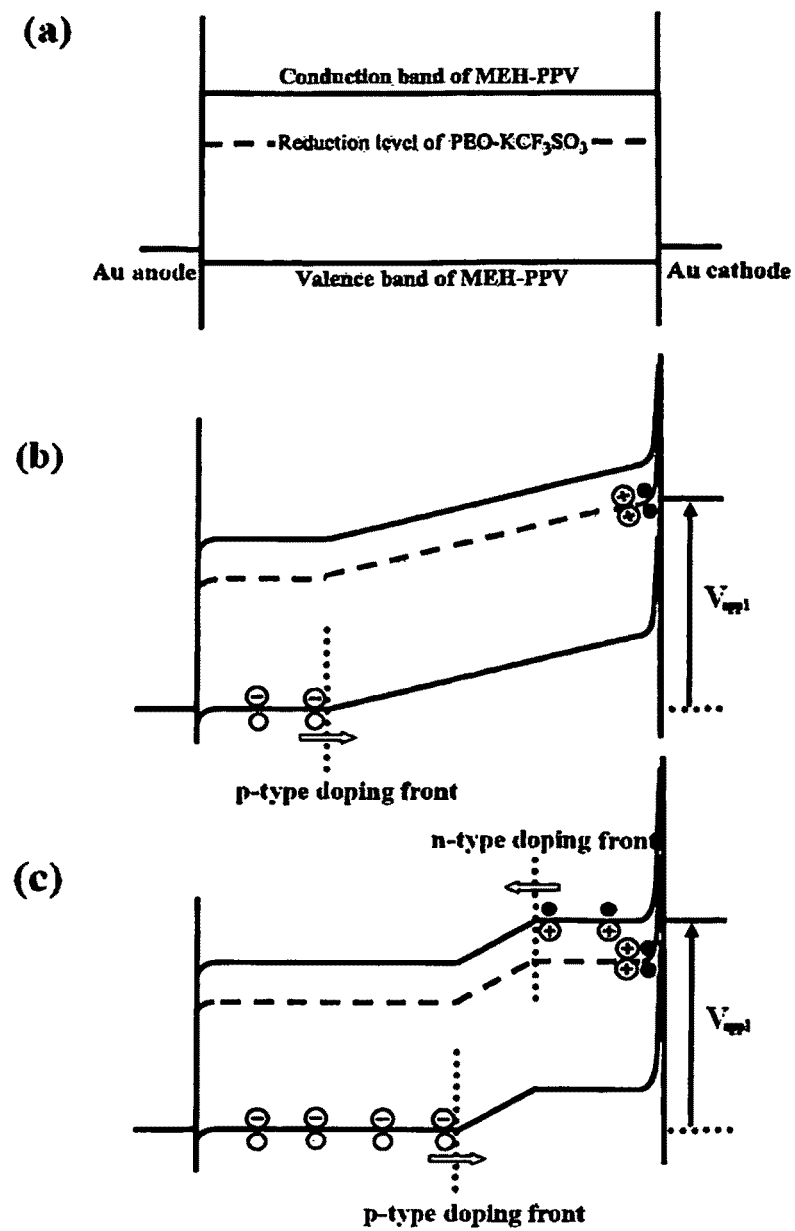
FIGS. 13a-13c. are schematic electron-energy level diagrams for an LEC, with the reduction level for the {KCF3SO3+PEO} electrolyte positioned within the band gap of the (MEH-PPV) conjugated polymer (CP). The electronic and ionic response during (b) the "initial stage" operation, when the p-type doping of the CP at the anode is balanced by an electrochemical side-reaction of the electrolyte at the cathode, and during (c) the "later stage" operation, when the subsequent p-type doping is balanced by n-type doping. The larger circles represent ions, the smaller open and solid circles represent holes and electron, respectively, and the arrows represent electronic charge injection resulting in electrochemical doping. For clarity, the electric double layers at the interfaces are omitted.

FIG. 13 presents the proposed operational mechanism of the LECs, in the form of a schematic electron-energy diagram. In agreement with the CV data, we include in FIG. 13(a) a reduction level of the {KCF$_3$SO$_3$+PEO} electrolyte at a lower energy than the conduction band edge of MEH-PPV (corresponding approximately to the n-type doping level). During the "initial stage" operation, as presented in FIG. 13(b), the electrochemical redox balance in the LEC is maintained by p-type doping (oxidation) of MEH-PPV at the anode and reduction of the electrolyte at the cathode. The latter reaction corresponds to the electrochemical side-reaction, which manifests itself in the lack of n-type doping progression during the initial stage operation (see FIGS. 9 and 10) and in the form of the degradation layer at the interface between the negative Au electrode and the active material (see FIG. 11). During the "later stage" operation, the p-type doping at the anode is instead balanced by n-type doping at the cathode, and it is during this process that n-type doping emerges in FIGS. 9 and 10.

A question that deserves attention at this stage is related to the transition between the electrochemical-side reaction and the n-type doping at the Au cathode, and why it takes place earlier at higher applied voltage and/or increased ionic conductivity of the active material. It is proposed that the side-reaction is the thermodynamically-preferred cathodic reaction (which is supported by the CV data), but that the n-type doping is the kinetically-preferred cathodic reaction at the Au cathode interface. This has the consequence that when very little overpotential is available at small drive voltage or because all overpotential is dropping over a low-ionic conductance undoped region, the thermodynamically-preferred side-reaction wins, since the n-type doping reaction simply is not energetically accessible. The situation changes at higher drive voltage or when the ionic conductance of the undoped region (separating the p-type and n-type regions) increases (because its ionic conductivity increases or because it decreases in size during later stages of the doping process) since there is then sufficient overpotential available at the cathodic interface to allow for both the side-reaction and n-type doping. In such a scenario, the kinetically-favoured reaction, the n-type doping, takes over. Moreover, during the later-stage operation when the effective cathodic interface is located at the n-type doping front, and not at the Au cathode, the acquired data indicate that n-type doping is the dominant process.

Two directly apparent consequences of the electrochemical side-reaction are that the n-type doping onset is delayed and that the p-n junction shifts towards the cathode. One can also expect that the electrochemical side-reaction will produce reactant residues on the surface of the Au cathode (as visualized in FIG. 11), which subsequently will at least partially block the initial n-type doping. The existence of a partial passivation layer on the Au cathode surface, but not on the Au anode surface, following the side-reaction is also consistent with the observation that the initial n-type doping front exhibits a spike-like appearance that is absent in the initial p-type front (see FIG. 9). The existence of an insulating degradation layer between the negative Au electrode and the active material could have implications for the voltage distribution in a turned-on LEC containing a light-emitting p-n junction, as it is reasonable to expect that it will cause a significant portion of the overpotential to shift from, e.g., the p-n junction to the degradation layer.

Figure 14:
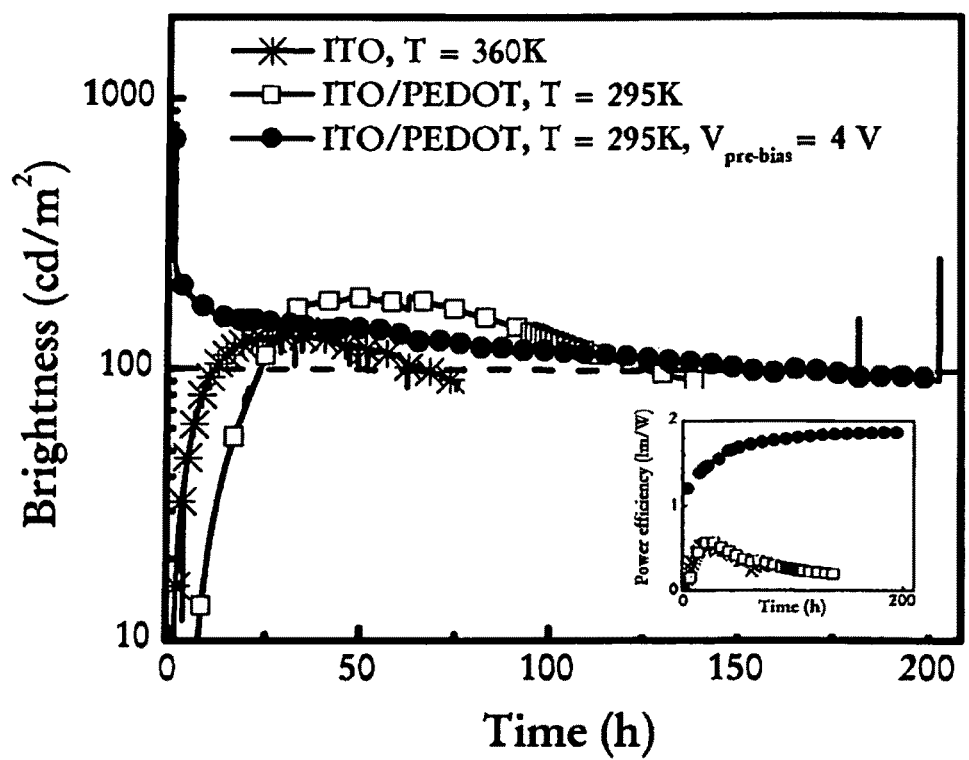
FIG. 14. illustrates the temporal evolution of the brightness of sandwich cells comprising an Al cathode and an {MEH-PPV:PEO:KCF$_3$SO$_3$} active material with a mass ratio of 1:0.085:0.03. The long-term operation was performed at V=3 V. Specifics for each anode structure and the initial measurement protocol are identified in the upper inset. The lower inset presents the power efficiency as a function of time.

Thus, in order to minimize the extent of the cathodic side reaction, and improve the device performance, it is relevant to apply a large potential (a "pre-bias") during the initial doping formation process. Thereafter, when the p-n junction has formed, it is appropriate to decrease the applied potential to allow for long-term operation. In FIG. 14 the effects of this operational protocol on the performance of sandwich cells is illustrated.

The sandwich-cell devices were identical to those presented in FIGS. 7 and 8, but a notable difference is that the testing was performed at room temperature instead of at an elevated temperature of T=360 K. The lowering of T resulted in an improvement in the operational lifetime by a factor of approximately two. Moreover, the well-established procedure of coating the surface of the ITO anode with a thin planarizing layer of the conducting polymer PEDOT was employed in order to investigate whether the roughness of the ITO surface might influence the device performance; but we find that this additional layer only results in a marginal improvement. The cumulative effects on the device performance by the lowering of T and the introduction of the PEDOT layer at the anodic interface are presented in FIG. 14 (compare the open squares with the stars).

It is chosen to "pre-bias" the sandwich cell devices at $V_{pre-bias}$=4 V during the initial doping process, and subsequently when significant light emission is attained and the doping completed (at t~0.5 h) lower the voltage to V=3 V. The results of the employment of a large pre-bias (solid circles in FIG. 14) are clearly encouraging: the operational lifetime increases from ~125 h to ~175 h, and the power efficiency increases markedly from a high value of ~0.5-0.6 lm/W to ~1.9 lm/W (see inset in FIG. 14).

It is expected that the high pre-bias during device turn-on will result in an increased amount of n-type doping at the expense of a cathodic side reaction involving the {PEO+ $KCF_3SO_3$} electrolyte. The consequential and desired outcome during long-term operation is a more "clean" cathodic interface and a more centered p-n junction; the former is attractive since it inhibits the formation of an overpotential at the cathodic interface, while the latter is desired since it will effectively eliminate documented problems related to exciton quenching by a nearby metal electrode, as described in Lee, K. W., et al., *Photophysical properties of tris(bipyridyl)ruthenium(II) thin films and devices*. Physical Chemistry Chemical Physics, 2003. 5(12): p. 2706-2709, and the formation of doping-induced short-circuits, as described in, J. H. Shin, S. Xiao, and L. Edman, *Polymer light-emitting electrochemical cells: The formation and effects of doping-induced micro shorts*. Advanced Functional Materials, 2006. 16(7): p. 949-956, and in Johansson, T., et al., *Light-emitting electrochemical cells from oligo(ethylene oxide)-substituted polythiophenes: Evidence for in situ doping*. Chemistry of Materials, 1999. 11(11): p. 3133-3139. The inhibition of these processes directly correlate to increased power conversion efficiency, while particularly the elimination of doping shorts and cathodic side reactions can be expected to result in an improved operational lifetime. Accordingly, it is plausible to rationalize the observed improved device performance following a high pre-bias to the alleviation of electrochemical side reactions. Moreover, a high pre-bias may also be attractive from a turn-on time perspective, and we find that the device pre-biased at $V_{pre-bias}$=4 V reaches a brightness of 100 $cd/m^2$>70 times faster than an identical device, which was invariably biased at V=3 V.

Figure 15:
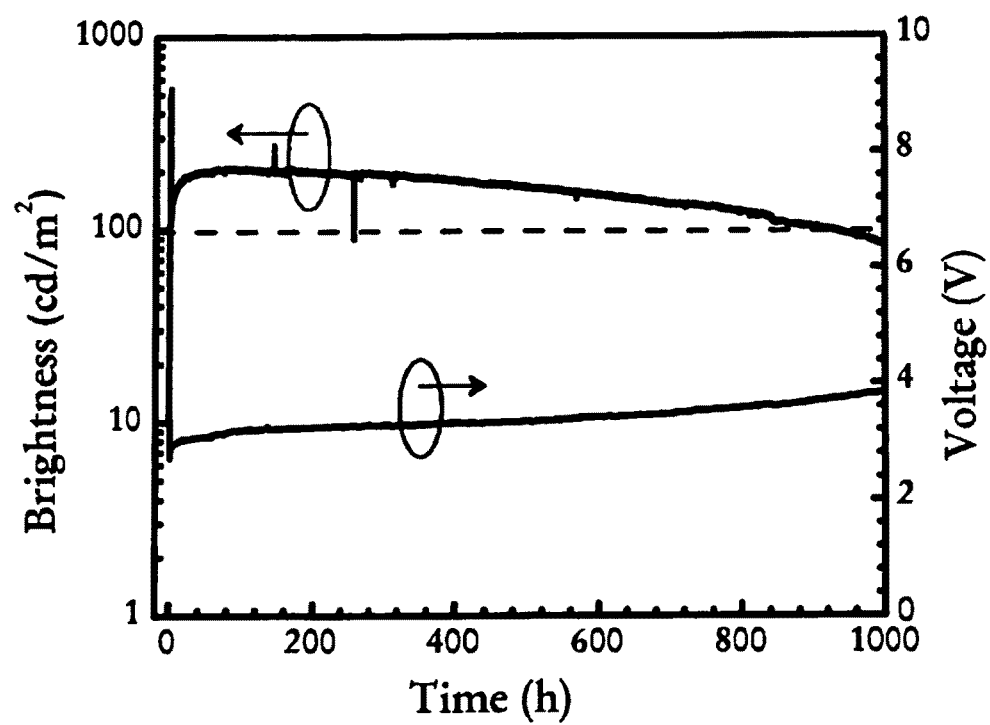
FIG. 15. illustrates the temporal evolution of the brightness (left) and the voltage (right) of an ITO/PEDOT/{MEH-PPV:PEO:KCF$_3$SO$_3$}/Al sandwich cell with an active material mass ratio of 1:0.085:0.03. The device was operated at T=295 K and in galvanostatic mode. The initial "pre-bias" current, $I_{pre-bias}$=0.005 A, was applied for t=0.5 h, and it was followed by long-term operation at I=0.001 A.

Inspired by the strong influence of the operation protocol on device performance, it is chosen to investigate the effects of the biasing mode. FIG. 15 presents brightness and voltage as a function of time for a sandwich cell operated at constant current (galvanostatic mode) instead of at constant voltage (potentiostatic mode, as was the case in FIGS. 7-8 and 14). In order to minimize cathodic side reactions and speed up the turn-on time, we set the initial pre-bias current to a high value of $I_{pre-bias}$=0.005 A for 0.5 h, directly after which the current was lowered to I=0.001 A. The results are highly promising: the initial power efficiency is >2 lm/W and the operational lifetime reaches an impressive value of ~1000 h, i.e., >40 days. It is also notable that the applied voltage never exceeds V=4 V during the more than month-long uninterrupted operation at I=0.001 A.

It is plausible that the improved device performance in FIG. 15 is due to the resulting high initial voltage of V=6 V during the first few seconds of high-current operation at $I_{pre-bias}$=0.005 A. The high pre-bias will further prohibit undesired cathodic electrochemical side reactions, as compared to the lower initial bias of V=3-4 V, which was applied during the potentiostatic operation in FIGS. 7, 8 and 14. It is further noted that self-heating effects can be rather prominent in the p-n junction region of an LEC during steady-state operation, due to non-radiative decay of excitons and Joule heating (the junction is undoped and as such the most resistive portion of the device); and that the better performance in galvanostatic mode as compared to potentiostatic mode, in part, also possibly can be attributed to a better heat management of the p-n junction region, as described in Wagberg, T., et al., *On the limited operational lifetime of light-emitting electrochemical cells*. Advanced Materials, 2008. 20(9): p. 1744-+, and Zhang, Y. G. and J. Gao, *Lifetime study of polymer light-emitting electrochemical cells*. Journal of Applied Physics, 2006. 100(8).

Figure 16:
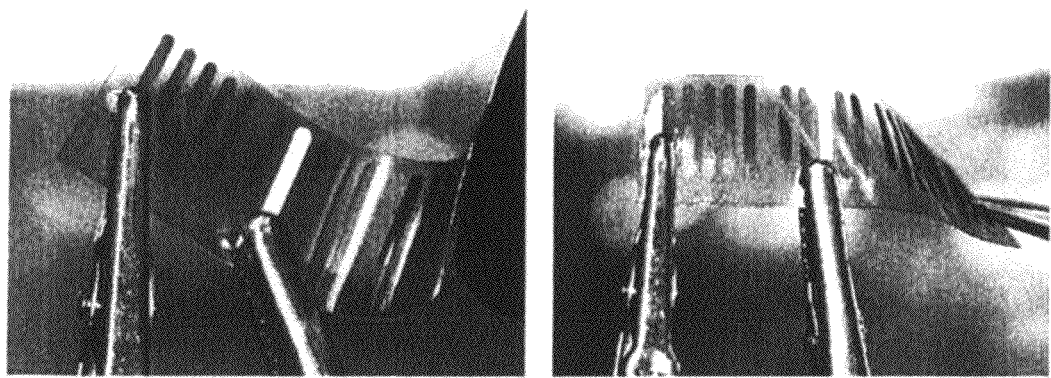
FIG. 16. are photographs of ITO/{MEH-PPV:PEO:KCF$_3$SO$_3$}/Al sandwich cells, with an active material mass ratio of 1:0.085:0.03, mounted on flexible PET substrates. The photographs of the flexed devices were taken during operation at T=295 K and I=0.005 A.

Furthermore, the first highly functional LEC devices on flexible ITO-coated PET substrates are demonstrated. FIG. 16 presents two photographs, which illustrate the conformability of such sandwich cells during operation. Under accelerated lifetime testing at a high applied current of I=0.01 A, it is found that the device performance (i.e., maximum brightness, power conversion efficiency, and operational lifetime) of such flexible LEC devices is on par with the performance of the best of the previously presented devices mounted on non-flexible glass-substrates.

Figure 2D:
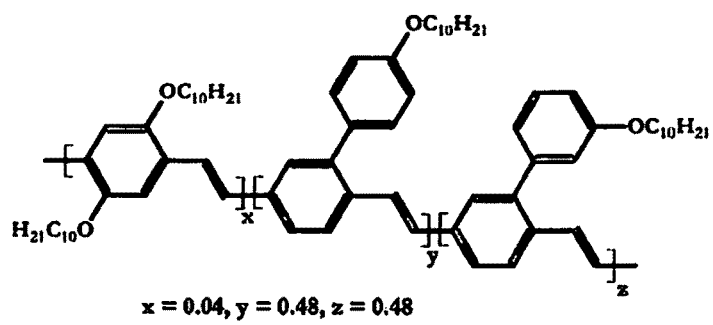
Figure 17:
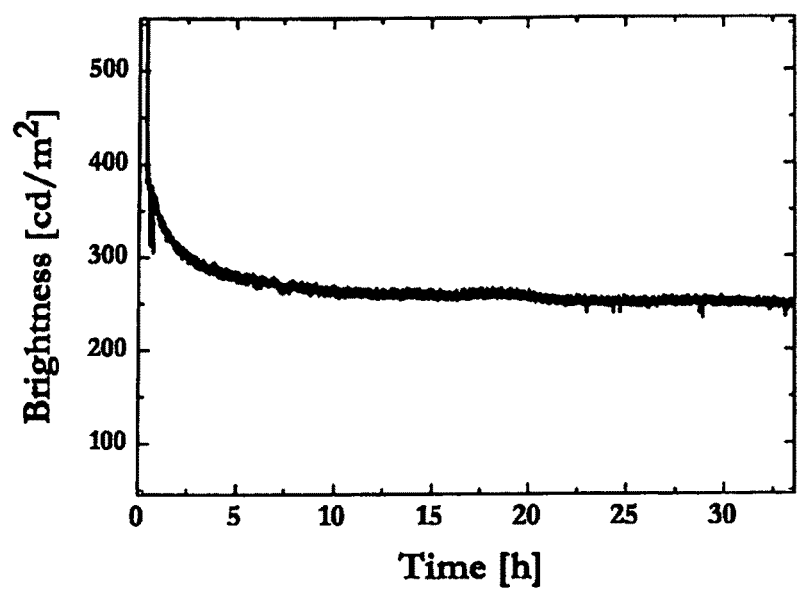
FIG. 17. illustrates the temporal evolution of the brightness of an ITO/PEDOT/{superyellow:PEO:KCF$_3$SO$_3$}/Al sandwich cell with an active material mass ratio of 1:0.085:0.03. The device was operated at T=295 K and in galvanostatic mode. The initial "pre-bias" current, $I_{pre-bias}$=0.01 A, was applied for t=0.4 h, and it was followed by long-term operation at I=0.001 A.
Figure 18:
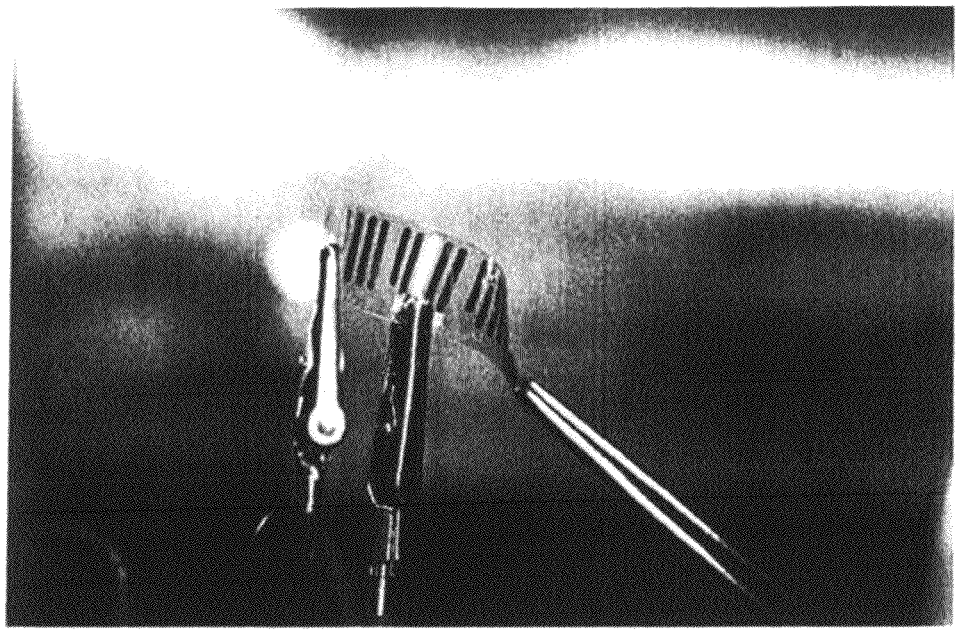
FIG. 18. are photographs of ITO/{superyellow:PEO:KCF$_3$SO$_3$}/Al sandwich cells, with an active material mass ratio of 1:0.085:0.03, mounted on flexible PET substrates. The photographs of the flexed devices were taken during operation at T=295 K.

Finally, it is demonstrated that it is possible to employ other active material constituents and attain a similar impressive device performance by using the aforementioned optimization of the active material composition and the high-prebias protocol. For instance, "superyellow" (see FIG. 2*d* for chemical structure) was used instead of MEH-PPV as the conjugated polymer. FIG. 17 presents an initial brightness vs. time test for a sandwich cell device operated at $I_{pre-bias}$=0.01 A for 0.4 h, directly after which the current was lowered to I=0.001 A. The power conversion efficiency of such yellow-emitting devices can reach 6 lm/W, and the initial operational lifetime data indicate that such superyellow-devices with an appropriate low electrolyte concentration and exposed to an appropriate operational protocol can exhibit an operational lifetime on par with similarly optimized MEH-PPV based devices. In FIG. 18 we present a fully functional flexible superyellow-based LEC device during operation.

To summarize, it is demonstrated that the composition of the active material and the protocol of operation have a profound influence on the device performance of LECs. Specifically, it is shown that a red-emitting LEC, comprising an active material mixture of {MEH-PPV:PEO:KCF$_3$SO$_3$} sandwiched between stable ITO and Al electrodes, can attain an impressive operational lifetime of ~1000 h at a significant brightness of >100 cd/m$^2$ and a high power conversion efficiency of 2 lm/W, provided that the concentration of the {PEO:KCF$_3$SO$_3$} electrolyte is optimized and that a high pre-bias is applied during the initial operation. Two efficient routes towards alleviation of detrimental chemical and electrochemical side reactions, which may be used separately or together, have been demonstrated. Furthermore, a flexible LEC with a highly promising device performance has been demonstrated.

EXAMPLES

The present disclosure is further illustrated by the following specific Example, which should not be construed as limiting in the scope or content of the claimed invention in any way.

In a first example, the conjugated polymer poly[2-methoxy-5-(2-ethyl-hexyloxy)-1,4-phenylenevinylene] (MEH-PPV) was used as received. Poly(ethylene oxide) (PEO, $M_w$=5×10$^6$, Aldrich) and the salt KCF$_3$SO$_3$ (98%, Alfa Aesar) were dried at a temperature (T) of 323 K and 473 K, respectively, under vacuum. Master solutions of 10 mg/mL concentration were prepared: MEH-PPV dissolved in chloroform (>99%, anhydrous, Aldrich), and PEO and KCF$_3$SO$_3$ dissolved separately in cyclohexanone (99%, Merck). Blend solutions were prepared by mixing the master solutions together in a MEH-PPV:PEO:KCF$_3$SO$_3$ mass ratio of 1:0.085:0.03, followed by stirring on a magnetic hot plate at T=323 K for at least 5 h. The indium tin oxide (ITO) glass substrates (1.5×1.5 cm$^2$, 20±5 ohms/sq., TFD Inc) were cleaned by subsequent ultrasonic treatment in detergent, acetone, and isopropanol solutions. The active material was deposited by spin-coating the blend solution at 800 rpm, which resulted in a film thickness of ~150 nm, as established by atomic force microscopy. The active material was thereafter dried on a hot plate at T=333 K for at least 5 h. Al electrodes were deposited by thermal evaporation at p<2× 10$^{-4}$ Pa. For some devices, a thin layer of poly(3,4-ethylenedioxythiophene)-poly(styrene sulfonate) (PEDOT-PSS 1.3 wt % dispersion in H$_2$O, Sigma Aldrich) was spin-coated on top of the ITO at 4000 rpm before the deposition of the active material. All of the above device preparation procedures, with the exception of the cleaning of substrates and the PEDOT deposition, were carried out in two interconnected N$_2$-filled glove boxes (O$_2$<3 ppm, H$_2$O<0.5 ppm). Before testing, the devices were dried in-situ in a cryostat for 2 h at T=360 K and under high vacuum (p<10$^{-3}$ Pa). All measurements were performed under high vacuum (p<10$^{-3}$ Pa) in the same optical-access cryostat. A computer-controlled source-measure unit (Keithley 2400) in combination with a calibrated photo-diode (Hamamatsu, S9219-01) were employed for the optoelectronic characterization of the LEC devices.

In another example, the conjugated polymer "superyellow" was used instead of MEH-PPV. Superyellow is a soluble phenyl-substituted PPV co-polymer, which was purchased from Merck, and it was used as received. It was handled in the same manner as the MEH-PPV polymer in the above example.

In yet another example, a flexible ITO-coated poly(ethylene terephthalate) (PET) substrate (PET60, Visiontek Systems Ltd.) was used instead of a non-flexible ITO glass substrate. These substrates were used as received.

Appendix 1—Experimental Details Related to Surface Cells

Poly[2-methoxy-5-(2-ethyl-hexyloxy)-1,4-phenylenevinylene] (MEH-PPV, Aldrich, $M_n$=40000-70000 g/mol) was used as received. Poly(ethylene oxide) (PEO, $M_w$=5×10$^6$, Aldrich) and the salt KCF$_3$SO$_3$ (98%, Alfa Aesar) were dried at a temperature (T) of 473 K under vacuum. Master solutions of 10 mg/mL concentration were prepared: MEH-PPV dissolved in chloroform (>99%, anhydrous, Aldrich), and PEO and KCF$_3$SO$_3$ dissolved separately in cyclohexanone (99%, Merck). A blend solution was prepared by mixing the master solutions together in a mass ratio of MEH-PPV:PEO: KCF$_3$SO$_3$=1:1.35:0.25, followed by stirring on a magnetic hot plate at T=323 K for at least 5 h. 1.5×1.5 cm$^2$ glass substrates were cleaned by subsequent ultrasonic treatment in detergent, acetone and isopropanol solutions. 100 nm-thick Au electrodes were deposited onto the cleaned glass substrates by thermal evaporation at p<2×10$^{-4}$ Pa. The interelectrode gap was established by an Al shadow mask.

The blend solution was deposited by spin-coating at 800 rpm for 60 s, which resulted in active material films with a thickness of 150 nm. The films were thereafter dried on a hot plate at T=333 K for at least 5 h. Finally, immediately preceding a measurement, in-situ drying in the cryostat for 2 h at T=360 K and under vacuum (p<10$^{-3}$ Pa) took place. All of the above device preparation procedures except for the cleaning of substrates were carried out in an Ar-filled glove box (O$_2$<3 ppm, H$_2$O<0.5 ppm). The characterization of devices was performed under vacuum (p<10$^{-3}$ Pa) in an optical-access cryostat. A computer-controlled source-measure unit (Keithley 2400) was employed to apply voltage and to measure the resulting current. The photographs of the doping progression were recorded under UV ($\lambda$=365 nm) illumination through the optical window of the cryostat, using a digital camera (Cannon EOS 20D) equipped with a macro lens.

Cyclic voltammetry (CV) measurements were carried out with a computer-controlled potentiostat/galvanostat (Autolab, PGSTAT302/FRA2, Eco Chemie) using the General Purpose Electrochemical Software (GPES, Eco Chemie). All the measurements were performed in an Ar-filled glove box ($O_2$<3 ppm, $H_2O$<0.5 ppm). The electrolyte solution was either 0.1 M tetrabutylammonium hexafluorophosphate ($TBAPF_6$, 99.0%, Fluka) in acetonitrile ($CH_3CN$, anhydrous, 99.8%, Aldrich) or 0.1 M potassium trifluoromethanesulfonate ($KCF_3SO_3$, 98%, Alfa Aesar) and 2 M (calculated as a number of repeat units of PEO per liter of solution) low-molecular-weight PEO ($M_w$=400, Polysciences) in acetonitrile. Au working electrodes were deposited onto precleaned glass substrates by thermal evaporation at p<$2\times10^{-4}$ Pa. MEH-PPV films were spin-coated from the chloroform solution (10 mg/ml, >99%, anhydrous, Aldrich) onto the Au electrodes at 800 rpm for 60 s and thereafter dried on a hot plate at T=323 K for ~1 h. A silver wire was used as the quasi-reference electrode. The silver wire was calibrated vs. the bis-($\eta$-cyclopentadienyl)iron(II)/bis-$\eta$-cyclopentadienyl)iron(II)$^+$ ion (ferrocene/ferrocenium ion, Fc/Fc$^+$) reference redox couple (ferrocene, ≥98%; Fluka) at the end of each measurement by adding ~$10^{-5}$ mol of ferrocene into the electrolyte solution and performing a sweep. A Pt rod was used as the counter electrode. The reduction/oxidation onset potentials were defined to correspond to the crossing point between the baseline and the half-peak-height tangent line. All the potentials are reported vs. the Fc/Fc$^+$ reference redox couple.

Appendix 2—Derivation of Equation (1)

The effective densities of the conjugated polymer (CP) and the salt (as well as the other components) in the active material (AM) can be related to their respective mass fractions by:

$$\rho_i = \frac{m_i}{m_{tot}} \cdot \rho_{AM} \qquad (1)$$

where $\rho_{AM}$ is the density of the active material.

The densities of the CP and the repeat unit of the CP(CPru) are identical:

$$\rho_{CPru} = \rho_{CP} \qquad (2)$$

The number densities of the components in the active material are given by:

$$N_i = \frac{N_A}{M_i} \cdot \rho_i \qquad (3)$$

where $N_A$ is Avogadro's constant and $M_i$ is the molar mass of component i.

We further note that for a univalent salt the following is true:

$$N_{cations} = N_{anions} = N_{salt} \qquad (4)$$

At ion depletion, all ions of one type have accumulated in one distinct doping region, where they electrostatically compensate the dopants (anions compensate holes in the p-type region and cations compensate electrons in the n-type region). Further, the doping concentration, and therefore the ion concentration, in the doped region is constant. Thus, the concentrations of dopants and ions in each doped region are related to the volume of that doped region ($V_i$, i=p, n) and the total volume of the active material ($V_{tot}$) by:

$$N_p = N_{anions,p} = \frac{V_{tot}}{V_p} \cdot N_{salt} \qquad (5)$$

$$N_n = N_{anions,n} = \frac{V_{tot}}{V_n} \cdot N_{salt} \qquad (6)$$

If the cross-section area of the active material is constant, the expressions for the p-type and n-type doping concentrations can be rewritten as:

$$N_p = \frac{d_{tot}}{d_p} \cdot N_{salt} = \rho_{salt} \cdot \frac{N_A \cdot d_{tot}}{M_{salt} \cdot d_p} \qquad (7)$$

$$N_n = \frac{d_{tot}}{d_n} \cdot N_{salt} = \rho_{salt} \cdot \frac{N_A \cdot d_{tot}}{M_{salt} \cdot d_n} \qquad (8)$$

where $d_{tot}$ is the total distance between the electrodes, and $d_p$ and $d_n$ are the total length of the p-type and n-type regions, respectively, in the inter-electrode direction.

The doping fraction in the doped regions ($x_i$, i=p, n) can now be calculated with the following equation:

$$x_i = \frac{N_i}{N_{CPru}} \qquad (9)$$

By including the results from above and solving specifically for the p-type region, we find that:

$$x_p = \frac{N_p}{N_{CPru}} = \frac{\rho_{salt} \cdot \frac{N_A \cdot d_{tot}}{M_{salt} \cdot d_p}}{\rho_{CPru} \cdot \frac{N_A}{M_{CP}}} = \frac{m_{salt}}{m_{CPru}} \cdot \frac{M_{CPru} \cdot d_{tot}}{M_{salt} \cdot d_p} \qquad (10)$$

We now solve for the ratio, z, between the mass of the salt and the mass of the conjugated polymer:

$$z = \frac{m_{salt}}{m_{CP}} = \frac{x_p \cdot d_p \cdot M_{salt}}{d_{tot} \cdot M_{CPru}} \qquad (11)$$

If we set the doping concentrations in the two doped regions to be equal (in reasonable agreement with recent experimental observations for the herein investigated LEC devices, see J. Fang, et al. *Identifying and alleviating electrochemical side-reactions in light-emitting electrochemical cells*, Journal of the American Chemical Society, 2008, 130 (13): p. 4562-4568) we find by symmetry that:

$$x_p = x_n = x_{doping} \qquad (12)$$

and $$d_p = d_n = \frac{d_{tot} - d_{pn}}{2} \qquad (13)$$

where $d_{pn}$ is the width of the undoped p-n junction.

Under this specific condition, eq. (11) can be rewritten as:

$$\zeta = \frac{m_{salt}}{m_{CP}} = \frac{x_{doping} \cdot (d_{tot} - d_{pu}) \cdot M_{salt}}{2 \cdot d_{tot} \cdot M_{CPru}} \quad (14)$$

The invention claimed is:

1. A light-emitting device comprising a first electrode, a second electrode, and a light-emitting active material contacting and separating the first and second electrodes, said active material comprising:
   a combination of a conjugated polymer and an electrolyte, said electrolyte comprising ions, allowing for electrochemical doping of the conjugated polymer,
   wherein a ratio between the ions and the conjugated polymer is selected to allow for the formation of:
   (i) a doped region at the respective electrode interface, which allows for injection and transport of electronic charge carriers into and through the doped regions, respectively, at zero or low overpotential, and
   (ii) an effectively undoped region, separating the doped regions, wherein injected electronic charge carriers are recombineable under excitation of the conjugated polymer and tile polymer is de-excitable under emission of light,
   wherein the ratio of the ions to the conjugated polymer is low enough, which corresponds to a surplus of conjugated polymer repeat units with respect to the number of ions, for the undoped region to remain effectively undoped and free from said ions, as substantially all ions in the active material are locked up in the doped regions.

2. The device as claimed in claim 1, wherein the conjugated polymer is hydrophobic and the electrolyte is hydrophilic, or wherein the conjugated polymer is hydrophilic and the electrolyte is hydrophobic.

3. The device as claimed in claim 1, wherein the ratio between the ions and the conjugated polymer is selected to provide a width of the undoped region which effectively eliminates detrimental interactions between the excited conjugated polymer and the dopants in the doped regions and the ions.

4. The device as claimed in claim 3, wherein the electrodes at least partially overlap each other, and the ratio between the ions and the conjugated polymer is selected to result in said width of the effectively undoped region being about 10 nm to 200 nm, or about 10-100 nm or about 10-50 nm or about 20 nm.

5. The device as claimed in claim 4, wherein the ratio between the mass of salt providing the ions and the mass of conjugated polymer is selected as about 0.01-3 times, or about 0.1-3, or about 0.5-2 or about 0.5-1 times z, which is calculated according to the formula:

$$\zeta = \frac{x_{doping} \cdot (d_{tot} - d_{pn}) \cdot M_{salt}}{2 \cdot d_{tot} \cdot M_{CPru}},$$

wherein $x_{doping}$ is a doping concentration in the doped regions, $d_{tot}$ is a total interelectrode distance, $d_{pn}$ is a width (in the interelectrode direction) of the undoped region, $M_{salt}$ is a molar mass of the salt, and $M_{CPru}$ is a molar mass of a repeat unit of the conjugated polymer.

6. The device as claimed in claim 1, wherein the ratio between the mass of ions and the mass of the conjugated polymer is about 0.005-0.10, or about 0.01-0.06.

7. The device as claimed in claim 1, wherein the electrodes are substantially co-planar, and the ratio between the ions and the conjugated polymer is selected to result in said width of the effectively undoped region being about 10 nm to 70 μm, or about 100 nm to 70 μm, or about 1 μm to 70 μm, or about 10 μm to 70 μm, or about 10 μm to 20 μm.

8. The device as claimed in claim 1, wherein said conjugated polymer is selected from the group consisting of poly(para-phenylene vinylene (PPV), polyfluorenylene (PF), poly (1,4-phenylene) (PP), polythiophene (PT), and neutral and ionic derivatives thereof.

9. The device as claimed in claim 1, wherein the electrolyte comprises a salt and/or at least one ionic liquid.

10. The device as claimed in claim 9, wherein the salt comprises at least one metal salt, said salt comprising a cation, such as Li, Na, K, Rb, Mg, or Ag, and a molecular anion, such as $CF_3SO_3$, $ClO_4$, or $(CF_sSO_2)_2N$.

11. The device as claimed in claim 1, wherein the electrolyte in the active material comprises an ion-dissolving material, such as:
   a polymer material, which may be selected from a group consisting of poly(ethylene oxide), poly(propylene oxide), methoxyethoxy-ethoxy substituted polyphosphazane, and polyether based polyurethane, or combinations thereof, or
   at least one non-polymer ion-dissolving material, such as a crown ether.

12. The device as claimed in claim 11, wherein a mass ratio between the ion-dissolving material and the conjugated polymer is about 0.01-0.25, about 0.01-0.20, about 0.01-0.17, about 0.05-0.25, about 0.05-0.20, about 0.05-0.17, about 0.08-0.25, about 0.08-0.20 or about 0.085-0.17.

13. A method for operating a light emitting device as claimed in claim 1, the method comprising pre-biasing the light-emitting device.

14. The method as claimed in claim 13, wherein the pre-biasing is provided when the light-emitting device is in a substantially pristine or relaxed state.

15. The method as claimed in claim 13, wherein a pre-biasing voltage is provided, which is higher than a nominal drive voltage of the light-emitting device.

16. The method as claimed in claim 13, wherein a pre-biasing current is provided, which is higher than a nominal drive current of the light-emitting device.

* * * * *